United States Patent
Woods et al.

(10) Patent No.: US 9,349,905 B2
(45) Date of Patent: May 24, 2016

(54) HYBRID MULTI-JUNCTION PHOTOVOLTAIC CELLS AND ASSOCIATED METHODS

(71) Applicant: Ascent Solar Technologies, Inc., Thornton, CO (US)

(72) Inventors: Lawrence M. Woods, Littleton, CO (US); Rosine M. Ribelin, Lakewood, CO (US); Prem Nath, Fort Lauderdale, FL (US)

(73) Assignee: ASCENT SOLAR TECHNOLOGIES, INC., Thornton, CO (US)

( * ) Notice: Subject to any disclaimer, the term of this patent is extended or adjusted under 35 U.S.C. 154(b) by 203 days.

(21) Appl. No.: 14/100,960

(22) Filed: Dec. 9, 2013

(65) Prior Publication Data

US 2014/0099748 A1 Apr. 10, 2014

Related U.S. Application Data

(62) Division of application No. 12/174,626, filed on Jul. 16, 2008, now abandoned.

(60) Provisional application No. 60/950,087, filed on Jul. 16, 2007, provisional application No. 60/956,107, filed on Aug. 15, 2007, provisional application No. 61/031,652, filed on Feb. 26, 2008.

(51) Int. Cl.
*H01L 31/18* (2006.01)
*H01L 21/385* (2006.01)
(Continued)

(52) U.S. Cl.
CPC ............ *H01L 31/18* (2013.01); *H01L 21/0256* (2013.01); *H01L 21/02579* (2013.01);
(Continued)

(58) Field of Classification Search
CPC ............ H01L 31/0392; H01L 31/0725; H01L 31/073; H01L 31/1828; H01L 31/0336; H01L 31/18; H01L 31/1884; H01L 21/385; H01L 21/0256; H01L 21/02579
See application file for complete search history.

(56) References Cited

U.S. PATENT DOCUMENTS 3,175,091 A 3/1965 Cheroff et al.
4,680,422 A 7/1987 Stanbery
(Continued)

FOREIGN PATENT DOCUMENTS

EP 0356059 2/1990
JP 57005375 1/1982

OTHER PUBLICATIONS

PCT/US08/70239 Invitation to Pay Additional Fees and Partial Search Report mailed May 19, 2009, 5 pages.
(Continued)

*Primary Examiner* — Golam Mowla
(74) *Attorney, Agent, or Firm* — Lathrop & Gage LLP

(57) ABSTRACT

A multi-junction photovoltaic cell includes a substrate and a back contact layer formed on the substrate. A low bandgap Group IB-IIIB-VIB$_2$ material solar absorber layer is formed on the back contact layer. A heterojunction partner layer is formed on the low bandgap solar absorber layer, to help form the bottom cell junction, and the heterojunction partner layer includes at least one layer of a high resistivity material having a resistivity of at least 100 ohms-centimeter. The high resistivity material has the formula (Zn and/or Mg)(S, Se, O, and/or OH). A conductive interconnect layer is formed above the heterojunction partner layer, and at least one additional single-junction photovoltaic cell is formed on the conductive interconnect layer, as a top cell. The top cell may have an amorphous Silicon or p-type Cadmium Selenide solar absorber layer. Cadmium Selenide may be converted from n-type to p-type with a chloride doping process.

18 Claims, 13 Drawing Sheets

(51) Int. Cl.
*H01L 31/0725* (2012.01)
*H01L 21/02* (2006.01)
*H01L 31/0336* (2006.01)
*H01L 31/0392* (2006.01)
*H01L 31/073* (2012.01)
*H01L 31/046* (2014.01)

(52) U.S. Cl.
CPC .......... *H01L21/385* (2013.01); *H01L 31/0336* (2013.01); *H01L 31/0725* (2013.01); *H01L 31/1828* (2013.01); *H01L 31/1884* (2013.01); *H01L 31/0392* (2013.01); *H01L 31/046* (2014.12); *H01L 31/073* (2013.01); *Y02E 10/543* (2013.01); *Y02P 70/521* (2015.11)

(56) References Cited

U.S. PATENT DOCUMENTS

| | | |
|---|---|---|
| 5,259,891 A | 11/1993 | Matsuyama et al. |
| 5,393,675 A | 2/1995 | Compaan |
| 5,909,632 A | 6/1999 | Gessert |
| 6,169,246 B1 | 1/2001 | Wu et al. |
| 6,368,892 B1 | 4/2002 | Arya |
| 6,783,640 B2 | 8/2004 | Yamashita et al. |
| 6,852,614 B1 | 2/2005 | Compaan et al. |
| 2001/0037823 A1 | 11/2001 | Middelman et al. |
| 2003/0230338 A1 | 12/2003 | Menezes |
| 2004/0003839 A1 | 1/2004 | Curtin |
| 2005/0257824 A1 | 11/2005 | Maltby et al. |
| 2006/0097259 A1 | 5/2006 | Suezaki et al. |
| 2006/0185717 A1 | 8/2006 | Ishibashi et al. |
| 2008/0115827 A1 | 5/2008 | Woods et al. |
| 2008/0314439 A1 | 12/2008 | Misra |

OTHER PUBLICATIONS

PCT/US2008/070240 International Search Report & Written Opinion mailed Dec. 11, 2008, 14 pages.
Langford, R.M. et al, "Effect of Copper and Chlorine on the Properties of SiO2 Encapsulated Polycrystalline CdSe Films", Journal of Electronic Materials 29(11), 1319-1327 (2000).
Martinaitis, A.V. et al., "Defect Structure of CdSe in Selenium Vapour", Phys. stat. sol. (a) 47, 187 (1978) pp. 187-194.
Ramrakhiani, M., "Zinc doped polycrystalline CdSe films for solar energy conversion", Materials Science and Engineering B35 (1995) pp. 493-496.
Shen, W.P., et al., "P-Type II-VI Compound Semiconductor Thin Flms Grown by Pulsed Laser Deposition", Mat. Res. Soc. Symp. Proc. vol. 388, 1995, pp. 91-96.
Liao, X. et al., "High Efficiency Amorphous Silicon Germanium Solar Cells", Conference Record of the 31st IEEE Photovoltaics Specialist Conference, Jan. 3-7, 2005, pp. 1444-1447.
Suntharalingam, V. "The P/I Interface Layer in Amorphous Silicon Solar Cells; A Numerical Case Study", Conference Record of the First IEEE Photovoltaics Specialists Conference, Dec. 5-9, 1994, vol. 1, pp. 618-621.
SBIR/STIR Proposal Abstract, "Monolithically-Integrated CIGS Devices", accessed via the Internet on Feb. 6, 2006, 2 pages.
SBIR/STIR Proposal Abstract, "Integrated CIGS Devices", accessed via the Internet on Feb. 6, 2006, 2 pages.
National Science Foundation, Award Abstract No. 0320375, 2 pages, publication date unkown, but published before filing date.
Itakura, M. et al., "Electrical Properties of Cadmium Selenide Single Crystals—Effect of Heat-Treatment in Selenium Vapor", Japanese Journal of Applied Physics, vol. 4, No. 8, pp. 560-566, Aug. 1965.
Henry, C.H., et al., "Optical Studies of Shallow Acceptors in CdS and CdSe", Physical Review B, vol. 4, No. 8, pp. 2453-2463, Oct. 15, 1971.
Ohtsuka et al., "P-type CdSe grown by Molecular Beam Epitaxy Using a Nitrogen Plasma", Applied Physics Letters, vol. 65, Issue 4, pp. 466-468, Jul. 25, 1994.
Baubinas et al, "P-type Conductivity in Undoped CdSe Single Crystals", Solid State Communications, vol. 15, pp. 1731-1733, 1974.
Abstract, Shen, W.P. et al., "P-type ZnS, ZnSe, CdS, and CdSe Thin Films Growth by Pulsed Laser Deposition", 1994 Conference on Lasers and Electro-Optics and the International Electronics Conference CLEO/IQEC, May 8-13, 1994, 1 page.
McCandless, B.E. et al., "Fabrication of Monolithic a-Si:H—CuInSe2/DdS Tandem Solar Cells", Conference Record of the 20th IEEE Photovoltaic Specialists Conference, Sep. 26-30, 1988, vol. 1, pp. 381-384.
Shafarman, W.N. et al., "Losses in CuInSe2-Based Thin Film Monolithic Tandem Solar Cells", IEEE Photovoltaic Specialists Conference, Jan. 3-7, 2005, pp. 231-234.
Nakada, T. et al., "Superstrate-Type Cu(In, Ga)Se2 Thin Film Solar Cells with ZnO Buffer Layers", Japanese Journal of Applied Physics, vol. 37, pp. 499-501, 1998.
Olsen, L.C., et al., "CIS Solar Cells with ZnO Buffer Layers", IEEE Photovoltaic Specialists Conference, May 13-17, 1996, pp. 997-1000.
SBIR Abstract, "CdSe Top Cells Enabling CdSe/CIGS Tandem Junction Photovoltaics", Jun. 8, 2007.
U.S. Appl. No. 12/174,626 select file history date Apr. 3, 2011 through Aug. 7, 2013, 139 pages.

HYBRID MULTI-JUNCTION PHOTOVOLTAIC CELLS AND ASSOCIATED METHODS

CROSS REFERENCE TO RELATED APPLICATIONS

This application is a divisional of U.S. patent application Ser. No. 12/174,626 filed 16 Jul. 2008, which claims benefit of priority to U.S. Provisional Patent Application Ser. No. 60/950,087 filed 16 Jul. 2007, U.S. Provisional Patent Application Ser. No. 60/956,107 filed 15 Aug. 2007, and U.S. Provisional Patent Application Ser. No. 61/031,652 filed 26 Feb. 2008. All of the aforementioned applications are hereby incorporated herein by reference.

U.S. GOVERNMENT RIGHTS

Certain claims with this invention were made with Government support under Advanced Technical Program Grant No. 70NANB8H4070 awarded by the United States Department of Commerce (NIST), and a Small-Business Innovative Research program contract No. FA9453-03-C-0216 awarded by the United States Department of Defense. The Government has certain rights in this invention.

BACKGROUND

Photovoltaic cells convert electromagnetic energy (e.g., sunlight) into an electric current; accordingly, they are commonly used to provide electric power in a diverse range of applications. For example, photovoltaic cells may be incorporated in and provide electric power for devices as diverse as hand-held calculators and space vehicles.

Photovoltaic cells having a variety of characteristics have been developed. One class of photovoltaic cells that is currently the subject of significant research is the thin-film class. Thin-film photovoltaic cells include a plurality of layers of thin films formed on a substrate.

As mentioned above, photovoltaic cells (e.g., thin-film photovoltaic cells) may be operated from sunlight. Sunlight generally includes a plurality of colors of light, including light in the infrared and near ultraviolet bands, where each color of light has a different energy. For example, blue light has greater energy per photon than red light.

It is known that absorption of light in a photovoltaic cell typically requires that each photon have energy greater than the bandgap energy of the absorbing material, such that carriers can be excited into the free or nearly free carrier bands (conduction and valence) in the absorbing material. These carriers then move to appropriate sides of the junction, providing an output voltage and current. Absorbed photon energy in excess of this bandgap energy is usually wasted in that additional carriers are not always generated. Semiconductor materials that have electrons as the dominant free carriers are defined as n-type materials, and materials that have holes, or the absence of an electron, as the dominant free carriers are defined as p-type materials.

The maximum output voltage of the cell is related to the bandgap of the materials used to form the junction. For example, higher bandgap materials can provide higher output voltages. As a result, photovoltaic cells optimized to absorb long wavelength, or low energy, photons will also absorb short-wavelength photons, but will waste much energy by producing a lower output voltage than attainable with cells optimized to absorb the short wavelength, high energy, photons.

A photovoltaic cell optimized to absorb short wavelength, e.g. blue, light will fail to efficiently absorb long wavelength, or red and infrared, light because the bandgap of the material is greater than the available energy in each photon, and therefore, photons are not absorbed and carriers are not promoted into the conduction.

SUMMARY

In an embodiment, a photovoltaic cell includes a transparent conductor layer, a first heterojunction partner layer, a p-type Cadmium Selenide layer in contact with the first heterojunction partner layer, and a first electrical contact layer.

In an embodiment, a hybrid multi-junction photovoltaic cell includes a substrate for providing mechanical support for the photovoltaic cell. The substrate is a polymer substrate. A back contact layer is formed on the substrate, and a bottom solar absorber layer is formed on the back contact layer. The bottom solar absorber layer includes one of the following materials: a low bandgap Group IB-IIIB-VIB$_2$ material having bulk p-type character, and an alloy of a low bandgap Group IB-IIIB-VIB$_2$ material having bulk p-type character. A heterojunction partner layer is formed on the bottom solar absorber layer, and a layer of p-type semiconductor is formed above the heterojunction partner layer. A layer of intrinsic semiconductor is formed on the layer of p-type semiconductor, and a layer of n-type semiconductor is formed on the layer of intrinsic semiconductor.

In an embodiment, a module of a plurality of hybrid multi-junction photovoltaic cells includes a substrate for providing mechanical support for the photovoltaic cells and a back contact layer formed on the substrate. A bottom solar absorber layer is formed on the back contact layer, and the bottom solar absorber layer includes one of the following materials: a low bandgap Group IB-IIIB-VIB$_2$ material having bulk p-type character, and an alloy of a low bandgap Group IB-IIIB-VIB$_2$ material having bulk p-type character. An n-type heterojunction partner layer is formed on the bottom solar absorber layer, and a contact layer of p-type semiconductor is formed above the heterojunction partner layer. A primary solar absorber layer is formed on the contact layer of p-type semiconductor, and the primary solar absorber layer is formed of an intrinsic semiconductor or a p-type semiconductor. A layer of n-type semiconductor is formed on the primary solar absorber layer, and a top contact layer is formed on the layer of n-type semiconductor. At least one first isolating scribe extends at least from a top surface of the layer of n-type semiconductor to a top surface of the substrate, and the first isolating scribe is filled with an insulating material. At least one connecting scribe extends at least from the top surface of the layer of n-type semiconductor to a top surface of the back contact layer, and the connecting scribe is filled with a conductive material. At least one second isolating scribe extends at least from a top surface of the top contact layer to a top surface of the bottom solar absorber layer.

In an embodiment, a multi-junction photovoltaic cell includes a substrate for providing mechanical support for the photovoltaic cell and a back contact layer formed on the substrate. A solar absorber layer is formed on the back contact layer, and the solar absorber layer is formed of a low bandgap Group IB-IIIB-VIB$_2$ material having bulk p-type character. A heterojunction partner layer is formed on the solar absorber layer, and the heterojunction partner layer includes at least one layer of a high resistivity material having a resistivity of at least 100 ohms-centimeter. The high resistivity material has the formula (Zn and/or Mg)(S, Se, O, and/or OH). A conductive interconnect layer is formed above the heterojunction partner layer, and at least one additional single-junction photovoltaic cell is formed on the conductive interconnect layer.

In an embodiment, a method of making a p-type Cadmium Selenide semiconductor material includes depositing a layer of Cadmium Selenide and coating the layer of Cadmium Selenide with a solution. The solution includes a solvent and at least one of the following chlorides: chlorides of Group IA elements, chlorides of group IB elements, and chlorides of Group IIIB elements. The coated layer of Cadmium Selenide is heated in an environment having an ambient temperature of between 300 and 500 degrees Celsius for a time between three and thirty minutes while at least partially preventing the evaporation of Selenium from the coated layer of Cadmium Selenide.

In an embodiment, a method of making a photovoltaic device includes depositing a contact layer, depositing a layer of Cadmium Selenide, and coating the layer of Cadmium Selenide with a solution. The solution includes a solvent and at least one of the following chlorides: chlorides of Group IA elements, chlorides of group IB elements, and chlorides of Group IIIB elements. The coated layer of Cadmium Selenide is heated in an environment having an ambient temperature of between 300 and 500 degrees Celsius for a time between three and thirty minutes while at least partially preventing the evaporation of Selenium from the coated layer of Cadmium Selenide. A heterojunction partner layer is deposited, and a transparent conductor layer is deposited.

In an embodiment, a method of making a photovoltaic device includes depositing a transparent conductor layer, depositing a heterojunction partner layer, and depositing a layer of Cadmium Selenide. The layer of Cadmium Selenide is coated with a solution including a solvent and at least one of the following chlorides: chlorides of Group IA elements, chlorides of group IB elements, and chlorides of Group IIIB elements. The coated layer of Cadmium Selenide is heated in an environment having an ambient temperature of between 300 and 500 degrees Celsius for a time between three and thirty minutes while at least partially preventing the evaporation of Selenium from the coated layer of Cadmium Selenide. A contact layer is deposited.

In an embodiment, a process for forming a hybrid multi-junction photovoltaic cell includes forming a first single-junction photovoltaic cell on a substrate. The step of forming the first single-junction photovolatic cell includes: (1) forming a first back contact layer on the substrate, (2) forming a first solar absorber layer on the back contact layer, the first solar absorber layer being formed of a low bandgap Group IB-IIIB-VIB$_2$ material having bulk p-type character, and (3) forming a first heterojunction partner layer on the first solar absorber layer, the first heterojunction partner layer including at least one layer of a high resistivity material having a resistivity of at least 100 ohms-centimeter, the high resistivity material being a material having the formula (Zn and/or Mg) (S, Se, O, and/or OH). A conductive interconnect layer is formed above the first heterojunction partner layer of the first single-junction photovoltaic cell. At least one additional single-junction photovoltaic cell is formed above the conductive interconnect layer.

DETAILED DESCRIPTION OF THE EMBODIMENTS

Figure 1:
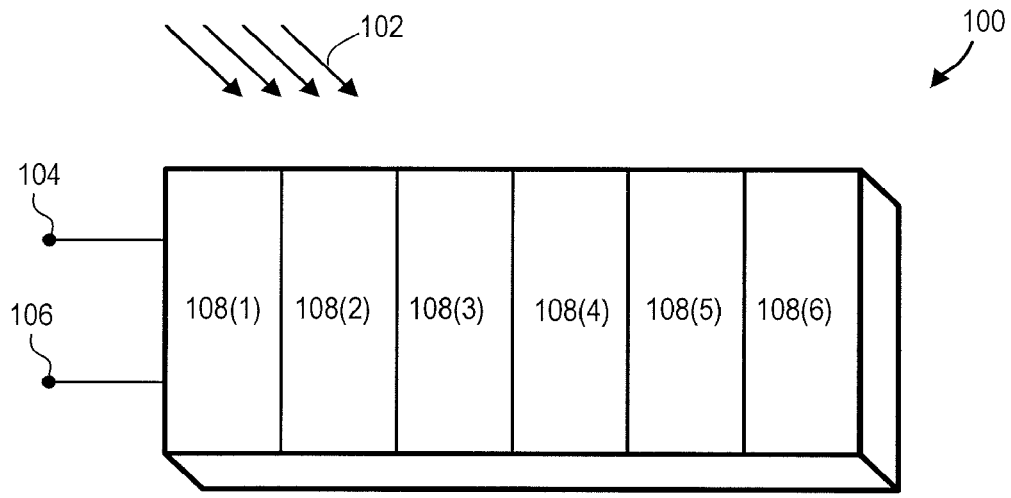
FIG. 1 is a top perspective view of one module of photovoltaic cells, in accordance with one embodiment.

It is noted that, for purposes of illustrative clarity, certain elements in the drawings may not be drawn to scale. Specific instances of an item may be referred to by use of a numeral in parentheses (e.g., photovoltaic cell 108(1)) while numerals without parentheses refer to any such item (e.g., photovoltaic cells 108).

FIG. 1 is a top perspective view of one module 100 of photovoltaic cells 108. Although module 100 is illustrated as having six photovoltaic cells 108, module 100 may have any quantity of photovoltaic cells. Furthermore, although photovoltaic cells 108 are illustrated in FIG. 1 as having a rectangular shape, photovoltaic cells 108 can have other shapes (e.g., a square or circle). Photovoltaic cells 108 are operable to convert electromagnetic energy 102 (e.g., sunlight) into an electric current. If module 100 includes several photovoltaic cells 108, the cells may be electrically connected in series to increase the voltage of module 100, in parallel to increase the maximum current capability of module 100, or in combinations of parallel and series to increase both the voltage and maximum current capability of module 100. The electric current generated by photovoltaic cells 108 is accessible via electrical terminals 104 and 106.

Photovoltaic cells 108 are thin-film photovoltaic cells; that is, photovoltaic cells 108 are formed of a plurality of thin-film layers on a substrate. In embodiments of module 100, several photovoltaic cells 108 are formed on a single common substrate; in such cases, the several photovoltaic cells 108 are considered to be "monolithically integrated" on the substrate.

Figure 2:
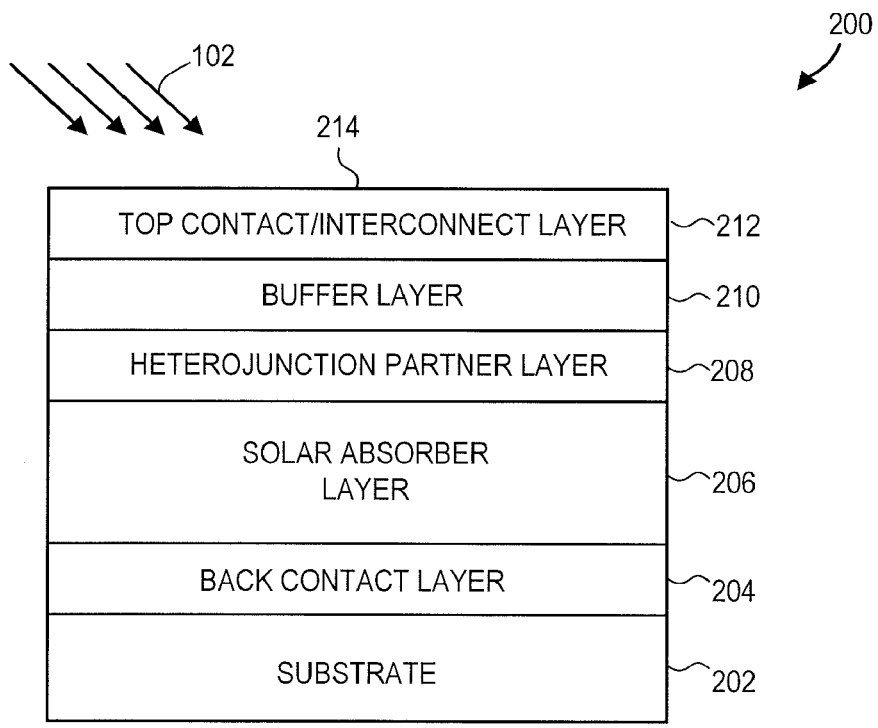
FIG. 2 is a cross sectional view of one photovoltaic cell, in accordance with one embodiment.

FIG. 2 is a cross sectional view of one photovoltaic cell 200. Photovoltaic cell 200 is an embodiment of photovoltaic cell 108 of FIG. 1. Photovoltaic cell 200 as illustrated in FIG. 2 is a single-junction photovoltaic cell; however, photovoltaic cell 200 may be combined with one or more additional single-junction photovoltaic cells to form a multi-junction photovoltaic cell, as discussed below. Furthermore, several photovoltaic cells 200 may be monolithically integrated onto substrate

202. Photovoltaic cell 200 absorbs electromagnetic energy 102 incident on its top surface 214.

Substrate 202 forms a base and provides mechanical support for photovoltaic cell 200. Substrate 202 affects characteristics of photovoltaic cell 200; accordingly, substrate 200 is chosen in accordance with the required characteristics of photovoltaic cell 200. For example, if photovoltaic cell 200 is to be flexible, substrate 202 must be flexible. As another example, if photovoltaic cell 200 is not to be electrically shorted to adjacent cells on the same substrate, substrate 202 should have an insulating surface. Further, if photovoltaic cell 200 is to be able to withstand high processing temperatures, substrate 202 must be able to withstand such high processing temperatures. Examples of materials that may be used to form substrate 202 include one of a polymer material (e.g., polyimide), a reinforced polymer material (e.g. carbon-fiber or glass-fiber reinforced polymer), metal foil, insulated metal foil (e.g., polymer coated metal foil), and glass.

Back contact layer 204 is formed on substrate 202. Back contact layer 204 provides electrical interface to photovoltaic cell 200. Back contact layer 204 is formed of a material that is compatible with (e.g., forms a good contact with) solar absorber layer 206; in an embodiment, back contact layer 204 includes molybdenum.

Solar absorber layer 206 is formed on back contact layer 204; solar absorber layer 206 is formed of a material having bulk p-type character. The term bulk p-type character means that at least a majority of the material is p-type. However, portions (e.g., a surface or a near surface, or doped portions) of a material having a bulk p-type character may not be p-type. For example, a surface of a material having a bulk p-type character may be n-type.

Solar absorber layer 206 has a photovoltaic effect such that solar absorber layer 206 is operable to at least partially absorb electromagnetic energy 102 having a certain range of wavelengths and create corresponding electron-hole pairs. In an embodiment, solar absorber layer 206 is formed of a Group IB-IIIB-VIB$_2$ material having bulk p-type character. The term Group IB-IIIB-VIB$_2$ material refers to a compound having a photovoltaic effect that is formed of at least one element from each of Groups IB, IIIB, and VIB of the periodic table, wherein there are typically two atoms of the Group VIB element for every one atom of the Group IB and IIIB elements. In the context of this disclosure, Group IB elements include Copper, Silver, and Gold; Group IIIB elements include Boron, Aluminum, Gallium, Indium, and Thallium; and Group VIB elements include Oxygen, Sulfur, Selenium, and Tellurium. Examples of materials that may be used to form solar absorber layer 206 therefore include Copper Indium DiSelenide, Copper Indium DiTelluride, an alloy formed of Copper Indium DiSelenide and at least one of Gallium, Aluminum, and Sulfur (e.g., Copper Indium Gallium DiSelenide), and an alloy formed of Copper Indium DiTelluride and at least one of Gallium, Aluminum, and Sulfur. In an embodiment, solar absorber layer 206 is formed of a low bandgap p-type Group IB-IIIB-VIB$_2$ material. A low bandgap material for purposes of this disclosure and the corresponding claims is a material that is tuned to absorb electromagnetic energy in the red and/or infrared portions of the electromagnetic spectrum. An embodiment of photovoltaic cell 200 having solar absorber layer 206 formed of a low bandgap material may be useful if photovoltaic cell 200 is combined with another single-junction photovoltaic cell tuned to absorb electromagnetic energy of a different portion of the electromagnetic spectrum (e.g., ultraviolet or blue light). In an embodiment, solar absorber layer 206 is formed using at least one of a sequential selenization process, a sulfurization process, a tellurization process, a thermal evaporation process, an electron beam evaporation process, a sputtering process, an electrodeposition process, a molecular beam epitaxy process, and a chemical vapor deposition process.

As another example, solar absorber layer 206 may be formed of Cadmium Selenide having a bulk p-type character ("p-type Cadmium Selenide"). Such p-type Cadmium Selenide may be obtained by converting n-type Cadmium Selenide to p-type as discussed below with respect to FIG. 10. For purposes of this disclosure and the corresponding claims, Cadmium Selenide is a material that is tuned to absorb electromagnetic energy in the red/yellow to blue and ultraviolet portions of the electromagnetic spectrum. An embodiment of photovoltaic cell 200 having solar absorber layer 206 formed of a Cadmium Selenide material may be useful if photovoltaic cell 200 is combined with another single-junction photovoltaic cell tuned to absorb electromagnetic energy of a different portion of the electromagnetic spectrum (e.g., red and infrared light).

Window layer or heterojunction partner layer 208 is formed on solar absorber layer 206. Heterojunction partner layer 208, for example, forms a heterojunction with the material of solar absorber layer 206 having bulk p-type character. Heterojunction partner layer 208 is, for example, formed of a high resistivity material having the formula (Zn and/or Mg) (S, Se, O, and/or OH) where the material may be formed of any combination of Zn and/or Mg, and one or more of S, Se, O, or OH. In an embodiment, heterojunction partner layer 208 is formed of Zinc Oxide. In another embodiment, heterojunction partner layer 208 is formed of a Zinc Magnesium Oxide alloy. Forming heterojunction partner layer 208 of such materials may advantageously help photovoltaic cell 200 to withstand higher processing temperatures than some other heterojunction partner layer materials, as discussed below. In the context of this disclosure and corresponding claims, the term high resistivity means a resistivity of at least 100 ohms-centimeter. In embodiments, heterojunction partner layer 208 has a resistivity of at least 1,000 ohms-centimeter. Forming heterojunction partner layer 208 of a high resistivity Zn compound (e.g., Zinc Oxide, Zinc Magnesium Oxide) may advantageously improve the high-temperature durability of photovoltaic cell 200 over a photovoltaic cell with a Zn compound having a lower resistivity. In an embodiment, heterojunction partner layer 208 is preferably formed using a chemical vapor deposition process (e.g., metal-organic chemical vapor deposition) such that a top surface of solar absorber layer 206 is not damaged by the deposition process.

As another example, heterojunction partner layer 208 may be formed of Cadmium Sulfide, such as when solar absorber layer 206 is formed of p-type Cadmium Selenide.

Photovoltaic cell 200 optionally includes buffer layer 210 formed on heterojunction partner layer 208; an exemplary material that may be used to form buffer layer 210 is undoped Zinc Oxide. Conductive top contact layer or interconnect layer 212 is formed on buffer layer 210, if present, or is formed on heterojunction partner layer 208 if buffer layer 210 is not present. Layer 212 is referred to as a top contact layer if photovoltaic cell 200 is not combined with an additional photovoltaic cell. Layer 212 is referred to as an interconnect layer if photovoltaic cell 200 is combined with one or more additional single-junction photovoltaic cells 200 to form a multi-junction photovoltaic cell; in such case interconnect layer 212 provides electrical connection between photovoltaic cell 200 and an additional single-junction photovoltaic cell formed on top surface 214 of photovoltaic cell 200. Top contact/interconnect layer 212 is electrically conductive and is at least partially transparent to electromagnetic energy 102 in order to allow electromagnetic energy 102 to reach solar absorber layer 206. Exemplary materials that may be used to form top contact/interconnect layer 212 include doped Zinc Oxide, undoped Zinc Oxide, Indium Tin Oxide, doped Tin Oxide, undoped Tin Oxide, n-type amorphous Silicon, n-type amorphous Silicon Germanium, hydrogenated amorphous Silicon carbide, and n-type microcrystalline amorphous Silicon.

One embodiment of photovoltaic cell 200 has the following configuration: substrate 202 formed of glass, back contact layer 204 formed of molybdenum, solar absorber layer 206 formed of Copper Indium DiSelenide, heterojunction partner layer 208 formed of Zinc Oxide, buffer layer 210 formed of Zinc Oxide, and top contact/interconnect layer 212 formed of Indium Tin Oxide.

As stated above, in embodiments, heterojunction partner layer 208 is formed of a high resistivity material having the formula (Zn and/or Mg)(S, Se, O, and/or OH). This heterojunction partner layer construction may result in photovoltaic cell 200 having a greater ability to withstand heat and/or vacuum stresses that some other thin-film photovoltaic cells. For example, in a thin-film photovoltaic cell including a solar absorber layer formed Copper Indium DiSelenide or Copper Indium DiTelluride and a heterojunction partner layer (window layer) formed of Cadmium Sulfide, heat and/or vacuum stresses may result in excessive cross-diffusion of constituent elements of the solar absorber layer and the heterojunction partner layer across their junction. This cross-diffusion causes degradation of the junction and overall performance of the photovoltaic cell; accordingly, such photovoltaic cell has a relatively low ability to withstand heat and vacuum stresses. However, if heterojunction partner layer 208 is formed of a high resistivity material having the formula (Zn and/or Mg)(S, Se, O, and/or OH), junction degradation may be reduced or eliminated.

Forming heterojunction partner layer 208 of a high resistivity material having the formula (Zn and/or Mg)(S, Se, O, and/or OH) also may allow photovoltaic cell 200 to have a greater ability to operate from electromagnetic energy including little or no blue colored light compared to some other thin-film photovoltaic cells. For example, a thin-film photovoltaic cell including a solar absorber layer formed from Copper Indium DiSelenide or Copper Indium DiTelluride and a heterojunction partner layer formed of Cadmium Sulfide generally performs better when the electromagnetic energy incident upon the window layer contains at least some blue colored light. This requirement is due to defects in the Cadmium Sulfide. However, this problem can be avoided by forming heterojunction partner layer 208 of a high resistivity material having the formula (Zn and/or Mg)(S, Se, O, and/or OH).

Forming an additional photovoltaic cell on a first photovoltaic cell commonly exposes the first photovoltaic cell to significant heat and/or vacuum stresses. Additionally, one or more additional photovoltaic cells formed on the first photovoltaic cell often blocks transmission of blue electromagnetic energy to the first photovoltaic cell. Accordingly, photovoltaic cell 200 may be an attractive photovoltaic cell for use as a bottom photovoltaic cell in a multi-junction photovoltaic cell due to photovoltaic cell 200's relatively low sensitivity to heat and vacuum stresses and ability to reliably operate from electromagnetic energy devoid of blue light.

Figure 3:
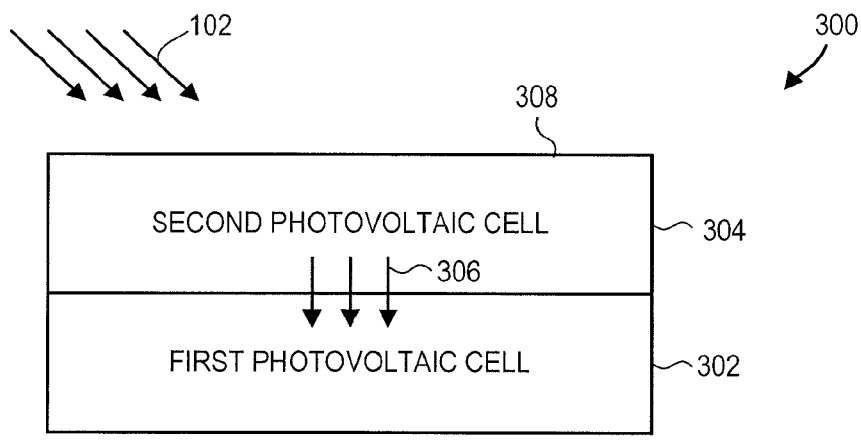
FIG. 3 is a cross sectional view of one two-junction photovoltaic cell, in accordance with one embodiment.
Figure 4:
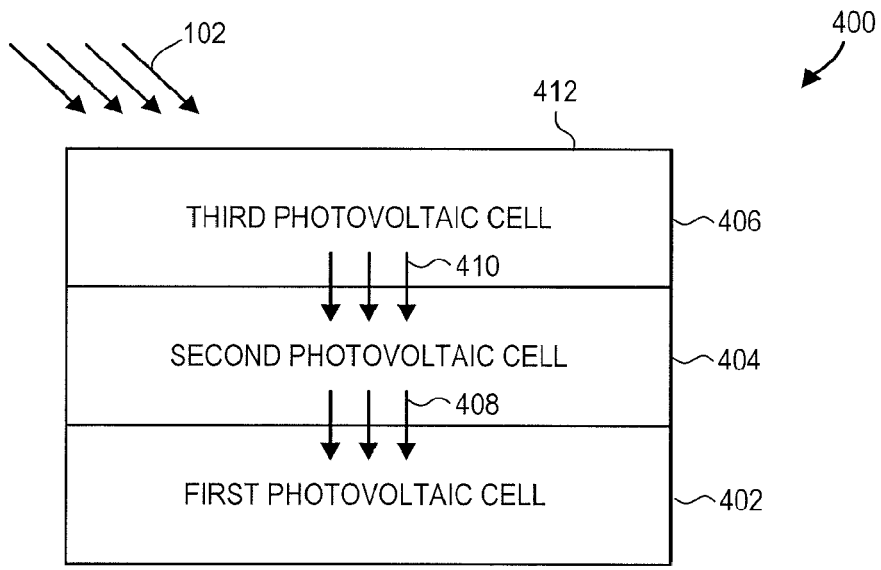
FIG. 4 is a cross sectional view of one three-junction photovoltaic cell, in accordance with one embodiment.

A multi-junction photovoltaic cell includes two or more single-junction photovoltaic cells optically aligned with each other, and each of the single-junction photovoltaic cells is tuned to respond to (i.e., absorb) electromagnetic energy having a different range of wavelengths. For example, FIG. 3 is a cross sectional view of one two-junction photovoltaic cell 300, and FIG. 4 is a cross sectional view of one three-junction photovoltaic cell 400. Two or more of the single-junction photovoltaic cells in a multi-junction photovoltaic cell may have different solar absorber layer materials; in such case, the multi-junction photovoltaic cell may be referred to as a hybrid photovoltaic cell.

Figure 5:
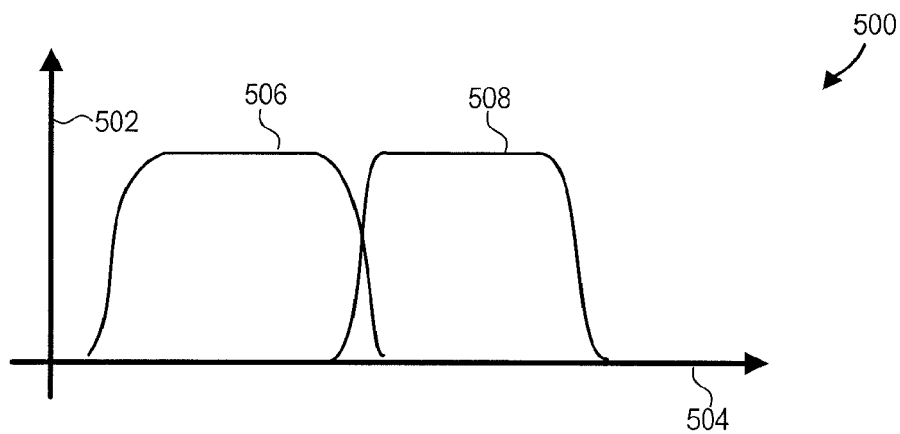
FIG. 5 is a graph of idealized spectral response versus wavelength of electromagnetic energy of an embodiment of the photovoltaic cell of FIG. 3.

A two junction or tandem photovoltaic cell 300 includes a second single-junction photovoltaic cell 304 formed on a first single-junction photovoltaic cell 302. Each of first and second photovoltaic cells 302 and 304 are designed to absorb portions of electromagnetic energy 102 having different ranges of wavelengths. FIG. 5, which is a graph 500 of idealized spectral response versus wavelength, illustrates one possible design of two-junction photovoltaic cell 300. A vertical axis 502 represents the magnitude of the spectral response of a photovoltaic cell; the spectral response essentially represents the photovoltaic cell's conversion of electromagnetic energy into an electric current. A horizontal axis 504 represents wavelength of electromagnetic energy. A curve 506 represents the spectral response of second photovoltaic cell 304 as a function of wavelength of electromagnetic energy, and a curve 508 represents the spectral response of first photovoltaic cell 302 as a function of wavelength of electromagnetic energy. As can be observed from FIG. 5, in an embodiment of two-junction photovoltaic cell 300 designed according to FIG. 5, second photovoltaic cell 304 responds to electromagnetic energy having a shorter wavelength than first photovoltaic cell 302. For example, second photovoltaic cell 304 may respond to (that is convert to an electric current), light generally having a blue color while first photovoltaic cell 302 responds to light generally having a red and/or infrared color. Thus, two-junction photovoltaic cell 300 is operable to generate an electric current from electromagnetic energy having two ranges of wavelengths as illustrated by curves 506 and 508.

In photovoltaic cell 300, electromagnetic energy 102 impinges a top surface 308 of photovoltaic cell 300; a portion of electromagnetic energy 102 having a certain range of wavelengths is absorbed by second photovoltaic cell 304 and is converted to an electric current. A portion of electromagnetic energy 102 that is not absorbed by second photovoltaic cell 304 passes to first photovoltaic cell 302 as indicated by arrows 306.

Three-junction photovoltaic cell 400 includes a third single-junction photovoltaic cell 406 formed on a second single-junction photovoltaic cell 404 which is in turn formed on a first single-junction photovoltaic cell 402. Each of first, second, and third single junction photovoltaic cells 402, 404, and 406 is designed to absorb portions of electromagnetic energy 102 having different ranges of wavelengths. Electromagnetic energy 102 impinges a top surface 412 of photovoltaic cell 400; a portion of electromagnetic energy 102 having a certain range of wavelengths is absorbed by third photovoltaic cell 406 and converted to an electric current. A portion of electromagnetic energy 102 that is not absorbed by third photovoltaic cell 406 passes to second photovoltaic cell 404 as indicated by arrows 410. Second photovoltaic cell 404 absorbs a portion of a certain range of wavelengths of electromagnetic energy 410, and the remainder of electromagnetic energy 410 passes to first photovoltaic cell 402 as indicated by arrows 408. A portion of electromagnetic energy 408 having a certain range of wavelengths is absorbed by first photovoltaic cell 402.

A multi-junction photovoltaic cell may have advantages over a single-junction photovoltaic cell. First, as discussed above with respect to FIGS. 3-5, a multi-junction photovoltaic cell has a plurality of single-junction photovoltaic cells each of which are tuned to respond to electromagnetic energy having a certain range of wavelengths. Accordingly, there may be a smaller difference between the energy level of at least some of the electromagnetic energy spectrum that creates 'free' electron-hole pairs in a solar absorber layer and the bandgap energy of the solar absorber layer in a multi-junction photovoltaic cell than in a single-junction photovoltaic cell. Therefore, a multi-junction photovoltaic cell may have a smaller energy loss due to thermalization of free carriers with excess energy above a solar absorber layer's bandgap energy level than a single-junction photovoltaic cell. As a result, a multi-junction photovoltaic cell may operate more efficiently than a single-junction photovoltaic cell.

Second, a multi-junction photovoltaic cell generally has a higher output voltage than a single-junction photovoltaic cell. This may be advantageous because the higher output voltage reduces the output current required to power a given load. Reducing the output current magnitude reduces resistive losses which directly increases the efficiency of the solar cell and module. Also, a multi-junction photovoltaic cell generally has a lower temperature coefficient than a single-junction photovoltaic cell, where the temperature coefficient quantifies additional power loss in the photovoltaic cell due to an increase in the photovoltaic cell's operating temperature. A lower temperature coefficient is beneficial because it reduces the power loss of the photovoltaic cell at elevated operating temperatures, which commonly occur in practical photovoltaic cell applications. Furthermore, increasing the output voltage of a photovoltaic cell may be advantageous in that it reduces the quantity of photovoltaic cells that must be electrically connected in series in order to provide a required output voltage. Reducing the quantity of series connected photovoltaic cells may in turn reduce monolithic integration cost and area of a module lost due to electrical interconnection of photovoltaic cells.

Figure 6:
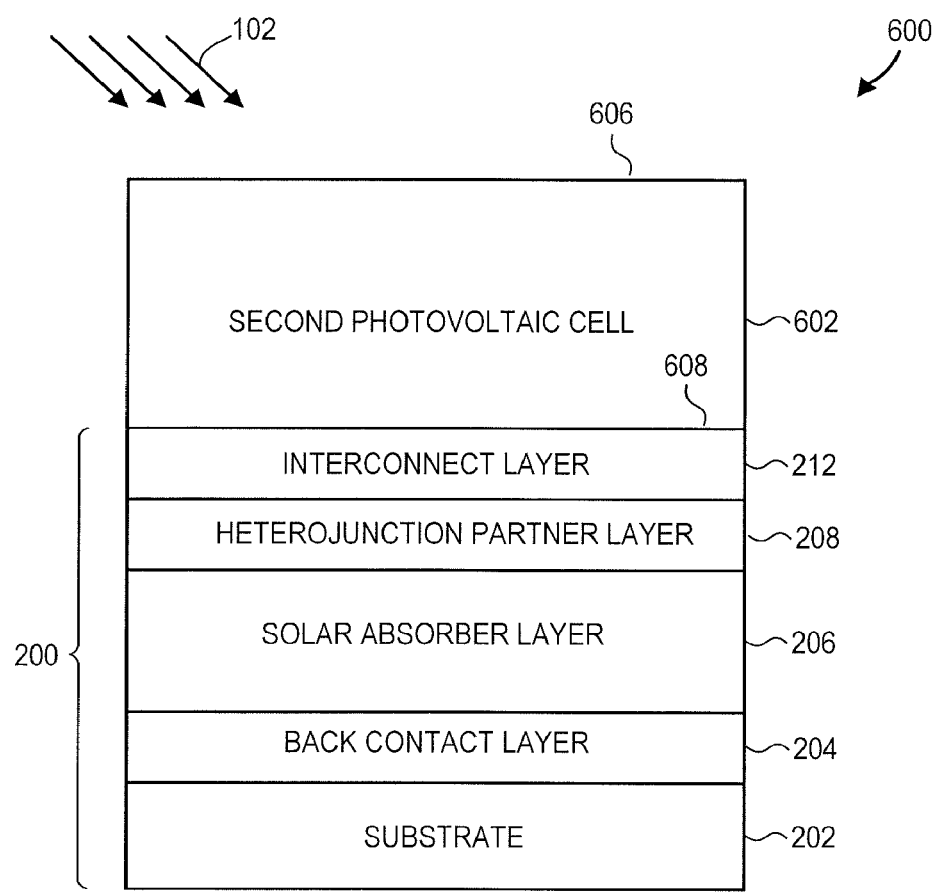
FIG. 6 is a cross sectional view of one multi-junction photovoltaic cell, in accordance with one embodiment.

FIG. 6 is a cross sectional view of one multi-junction photovoltaic cell 600. Photovoltaic cell 600, which is an embodiment of photovoltaic cell 108, includes a second single-junction photovoltaic cell 602 formed on photovoltaic cell 200. Although photovoltaic cell 600 is illustrated in FIG. 6 as being a two-junction photovoltaic cell, photovoltaic cell 600 may have more than two junctions. For example, photovoltaic cell 600 could be a three-junction photovoltaic cell if a third single-junction photovoltaic cell were formed on a top surface 606 of second photovoltaic cell 602. Multiple photovoltaic cells 600 may be monolithically integrated onto substrate 202; and one or more substrates 202 with cells may be combined into a module or solar panel.

As discussed above with respect to FIG. 2, photovoltaic cell 200 may optionally include a buffer layer (not shown in FIG. 6) disposed between heterojunction partner layer 208 and interconnect layer 212. In addition to providing an interface between photovoltaic cell 200 and second photovoltaic cell 602 (FIG. 6), an embodiment of interconnect layer 212 may reflect some electromagnetic energy that passes through second photovoltaic cell 602 back into second photovoltaic cell 602 for absorption by it. As discussed above, embodiments of photovoltaic cell 200 may withstand higher temperatures and/or vacuum stresses better than some other thin-film photovoltaic cells; accordingly, it is desirable that photovoltaic cell 200 can withstand deposition of at least one additional photovoltaic cell (e.g., second photovoltaic cell 602) on top surface 608 of interconnect layer 212. Additionally, as discussed above, certain embodiments of bottom photovoltaic cell 200 do not need to absorb blue colored light in order to operate well. Accordingly, photovoltaic cell 200 may operate well even if second photovoltaic cell 602 (and any additional single-junction photovoltaic cells) absorbs some or all of the blue light of electromagnetic energy 102.

Second photovoltaic cell 602 is tuned to be complimentary to photovoltaic cell 200. For example, second photovoltaic cell 602 is optimized to absorb a certain range of wavelengths of electromagnetic energy that first photovoltaic cell 200 is not optimized to absorb. Examples of second photovoltaic cells 602 include a solar absorber layer formed of a material including one of a Cu(In, Ga, Al)Se$_2$ compound, a Cu(In, Ga, Al)S$_2$ compound, amorphous Silicon (e.g., hydrogenated amorphous Silicon), a hydrogenated amorphous Silicon Germanium alloy, a (Cd, Zn, Mg, Mn)Te compound, and p-type Cadmium Selenide. By a Cu (In, Ga, Al) Se$_2$ compound, a compound is meant that comprises Copper, Selenium, and at least one of Indium, Gallium, or Aluminum. By a Cu(In, Ga, Al)S$_2$ compound, a compound is meant that comprises Copper, Sulfur, and at least one of Indium, Gallium, or Aluminum. By a (Cd, Zn, Mg, Mn)Te compound, a compound is meant that comprises Tellurium and at least one of Cadmium, Zinc, Magnesium, or Manganese.

Figure 7:
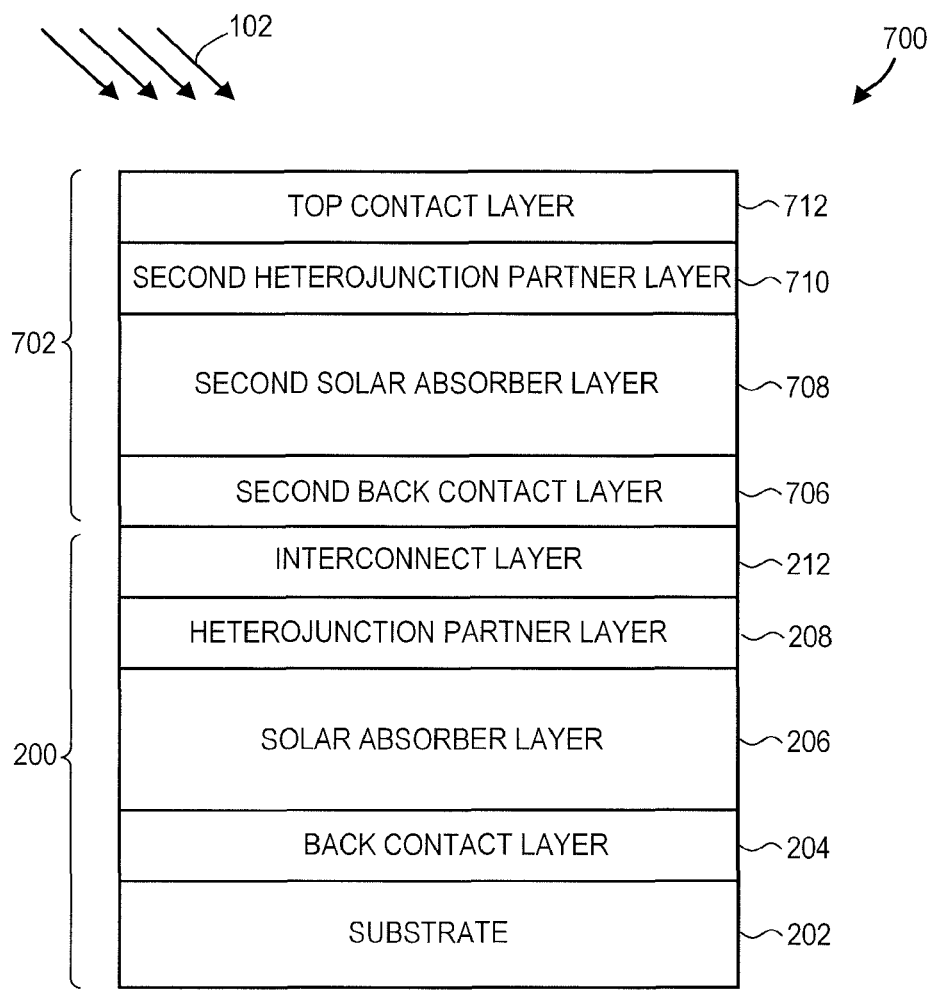
FIG. 7 is a cross sectional view of one multi-junction photovoltaic cell, in accordance with one embodiment.

FIG. 7 is a cross sectional view of one multi-junction photovoltaic cell 700, which is an embodiment of photovoltaic cell 600. Photovoltaic cell 702 is an embodiment of photovoltaic cell 602. A plurality of photovoltaic cells 700 may be monolithically integrated onto substrate 202.

Second photovoltaic cell 702 optionally includes a second back contact layer 706 formed on interconnect layer 212. Second back contract layer 706 is at least partially transparent to electromagnetic energy having a certain range of wavelengths intended to be absorbed by solar absorber layer 206 of photovoltaic cell 200. If second back contact layer 706 is not included in photovoltaic cell 700, interconnect layer 212 serves as a back contact for photovoltaic cell 702.

Second solar absorber layer 708 is formed on second back contact layer 706 (or an interconnect layer 212 if second back contact layer 706 is not present). In an embodiment, solar absorber layer 708 is formed of a material including one of a Cu(In, Ga, Al)Se$_2$ compound, a Cu(In, Ga, Al)S$_2$ compound, amorphous Silicon (e.g., hydrogenated Amorphous Silicon), a hydrogenated amorphous Silicon Germanium alloy, Cadmium Telluride, a (Cd, Zn, Mg, Mn)Te compound, and p-type Cadmium Selenide. Second solar absorber layer 708 has a higher bandgap energy than solar absorber layer 206 such that second solar absorber layer 708 absorbs electromagnetic energy having shorter wavelengths than that absorbed by solar absorber layer 206.

Second heterojunction partner layer 710 is formed on second solar absorber layer 708. In an embodiment, second heterojunction partner layer 710 is formed of Cadmium Sulfide and second solar absorber layer 708 is formed of p-type Cadmium Selenide.

Top contact layer 712 is formed on second heterojunction partner layer 710. A buffer layer (not shown in FIG. 7) is optionally disposed between second heterojunction partner layer 710 and top contact layer 712. Top contact layer 712 and second heterojunction partner layer 710 are each at least partially transparent to wavelengths of electromagnetic energy 102 intended to be absorbed by second solar absorber layer 708 and solar absorber layer 206.

Figure 8:
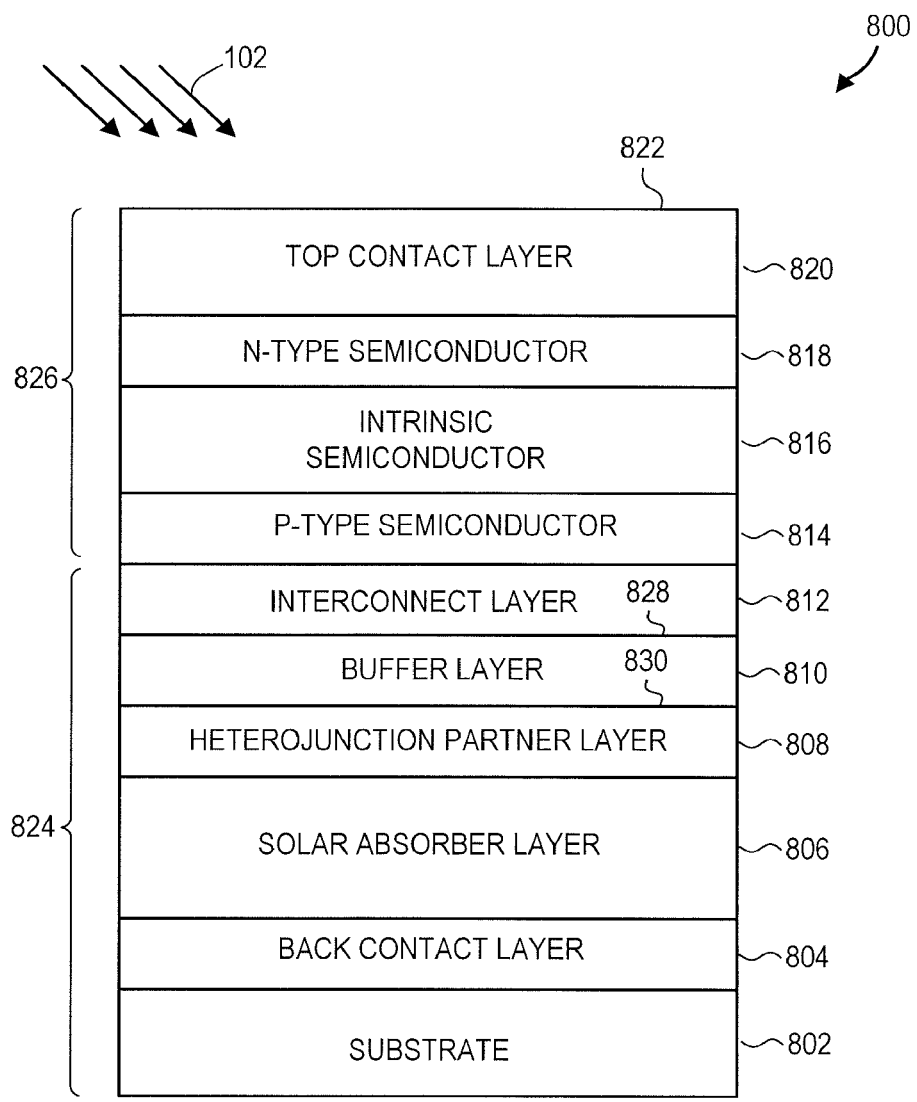
FIG. 8 is a cross sectional view of one multi-junction photovoltaic cell, in accordance with one embodiment.

FIG. 8 is a cross sectional view of one multi-junction photovoltaic cell 800, which is an embodiment of photovoltaic cell 108. Photovoltaic cell 800 is illustrated in FIG. 8 as including a second single-junction photovoltaic cell 826 formed on a first single-junction photovoltaic cell 824. Accordingly, photovoltaic cell 800 is illustrated in FIG. 8 as being a two-junction or tandem photovoltaic cell. However, photovoltaic cell 800 may include more than two stacked single-junction photovoltaic cells and thereby have more than two junctions. For example, photovoltaic cell 800 could be a three-junction photovoltaic cell if a third single-junction photovoltaic cell were formed on a top surface 822 of photovoltaic cell 800. Photovoltaic cell 800 may be considered to be a hybrid photovoltaic cell because at least two of its single junction photovoltaic cells (e.g., photovoltaic cells 824 and 826) have different materials in their solar absorber layers.

First single-junction photovoltaic cell 824 includes a substrate 802, a back contact layer 804, a solar absorber layer 806, a heterojunction partner layer 808, an optional buffer layer 810, and an optional interconnect layer 812. Several photovoltaic cells 800 may be monolithically integrated onto substrate 802. Substrate 802 forms a base and provides mechanical support for photovoltaic cell 800. Examples of materials that may be used to form substrate 802 include polymers (e.g., polyimide), reinforced polymers, insulated metal foil (e.g., polymer coated metal foil), and glass. If substrate 802 is formed of a polymer or insulated metal foil, photovoltaic cell 800 may advantageously be flexible and lightweight compared to photovoltaic cells having a glass substrate. Additionally, forming substrate 802 of a polymer or insulated metal foil may advantageously allow photovoltaic cell 800 to support monolithic integration in contrast to photovoltaic cells having an uninsulated metal substrate. It should be noted, however, that substrate 802 could be formed of metal foil if photovoltaic cell 800 will not be used in monolithic integration applications.

Back contact layer 804 is formed on substrate 802. Back contact layer 804 provides an electrical interface to photovoltaic cell 800. Back contact layer 804 is formed of a material that is compatible with (e.g., forms a good contact with) solar absorber layer 806; in an embodiment, back contact layer 804 includes molybdenum.

Solar absorber layer 806 is formed on back contact layer 804; solar absorber layer 806 is formed of a material having a bulk p-type character and a photovoltaic effect such that solar absorber layer 806 is operable to at least partially absorb electromagnetic energy 102 and create corresponding electron-hole pairs. In particular, solar absorber layer 806 is formed of a Group IB-IIIB-VIB$_2$ material having bulk p-type character or its alloys. The Group IB-IIIB-VIB$_2$ material or its alloys may be a low bandgap material such that solar absorber layer 806 responds to relatively long wavelengths of electromagnetic energy (e.g., red and/or infrared light). Examples of materials that may be used to form solar absorber layer 806 include Copper Indium DiSelenide, Copper Indium DiTelluride, an alloy formed of Copper Indium DiSelenide and at least one of Gallium, Aluminum, and Sulfur, and an alloy formed of Copper Indium DiTelluride and at least one of Gallium, Aluminum, and Sulfur.

Heterojunction partner layer 808 is formed on solar absorber layer 806. Heterojunction partner layer 808 may form a heterojunction with the material of solar absorber layer 806 having bulk p-type character. In an embodiment, Heterojunction partner layer 808 is formed of n-type material (e.g., Cadmium Sulfide). In another embodiment, heterojunction partner layer 808 is similar to heterojunction partner layer 208 of photovoltaic cell 200 of FIG. 2 in that heterojunction partner layer 808 is formed of a high resistivity material having the formula (Zn and/or Mg)(S, Se, O, and/or OH).

Photovoltaic cell 800 optionally includes buffer layer 810; an exemplary material that may be used to form buffer layer 810 is undoped or high-resistivity ZnO. Conductive interconnect layer 812 is optionally formed on buffer layer 810, if present, or on heterojunction partner layer 808 if buffer layer 810 is not present. Conductive interconnect layer 812 is required if heterojunction partner layer 808 is formed of a high resistivity material; however, if heterojunction partner layer 808 is formed of a conductive n-type material, interconnect layer 812 is not included in an embodiment of photovoltaic cell 800. Interconnect layer 812 functions as an electrical and an optical interface between first photovoltaic cell 824 and second photovoltaic cell 826. If interconnect layer 812 is not used, second photovoltaic cell 826 is formed directly on first photovoltaic cell 824. Interconnect layer 812 may include a doped Zinc Oxide, undoped Zinc Oxide, Indium Tin Oxide, a doped Tin Oxide, undoped Tin Oxide, n-type amorphous Silicon, n-type amorphous Silicon Germanium, hydrogenated amorphous Silicon Carbide, and n-type microcrystalline Silicon. Interconnect layer 812 is at least partially transparent to electromagnetic energy intended to be absorbed by first photovoltaic cell 824. In an embodiment of photovoltaic cell 800, interconnect layer 812 serves to reflect some electromagnetic energy that passes through second photovoltaic cell 826 back into second photovoltaic cell 826 for absorption by it.

Second photovoltaic cell 826 includes layers 814, 816, and 818 of semiconductor material (e.g., amorphous Silicon) and an optional top contact layer 820. In particular, a layer 814 of p-type semiconductor (e.g., p-type amorphous Silicon) is formed on interconnect layer 812 (if present), or on a top surface (e.g., surfaces 828 or 830) of first photovoltaic cell 824 if interconnect layer 812 is not present. A layer 816 of intrinsic semiconductor (e.g., intrinsic amorphous Silicon) is formed on layer 814 of p-type semiconductor, and a layer 818 of n-type semiconductor (e.g., n-type amorphous Silicon) is formed on the layer 816 of intrinsic semiconductor. In an embodiment, layers 814, 816, and 818 are formed of hydrogenated amorphous Silicon. In another embodiment, layers 814 and 818 are formed of hydrogenated amorphous Silicon, and layer 816 is formed of hydrogenated amorphous Silicon Germanium. Layers 814 and 818 may also be formed of microcrystalline Silicon in an embodiment. In another embodiment, layers 814 and 818 are each formed from one of hydrogenated amorphous Silicon Germanium, hydrogenated amorphous Silicon Carbide, and nanocrystalline Silicon. In embodiments of photovoltaic cell 800, layer 816 has a graded composition or is formed of several discrete sublayers. Layer 816, for example, is formed of a plurality of different materials, where each material has a different Silicon germanium alloy composition. As another example, layer 816 has a variable level of small crystalline domains of specified sizes to achieve specified bandgaps. As yet another example, layer 816 may be a graded bandgap layer of intrinsic amorphous Silicon germanium. Such designs of layers of intrinsic amorphous Silicon are discussed in the art (for example: X. Liao et al, Proc. 31$^{st}$ IEEE PVSC, 2005, and V. Suntharalingam et al, Proc. 1$^{st}$ WCPEC, 1994) and are used, for example, to reduce efficiency losses at interfaces to layer 816.

Top contact layer 820 is optionally formed on layer 818 of n-type semiconductor. If one or more additional photovoltaic cells are formed on multi-junction photovoltaic cell 800, top contact layer 820 need not be included. Top contact layer 820 is at least partially transparent to electromagnetic energy 102 in order to allow electromagnetic energy 102 to reach first and second photovoltaic cells 824 and 826. Examples of materials that may be used to form top contact layer 820 include one of doped Zinc Oxide, Indium Tin Oxide, and doped Tin Oxide. A top surface 822 of top contact layer 820 may be roughened to increase light trapping of second photovoltaic cell 826, thereby increasing its current generation and efficiency.

Embodiments of photovolatic cell 800 advantageously have a relatively high efficiency despite being formed on a polyimide substrate. A polyimide substrate generally cannot support high processing temperatures required to fabricate a high efficiency photovoltaic cell. However, even if embodiments of photovoltaic cell 800 are fabricated at low temperatures, the multijunction structure of photovoltaic cell 800 may enable the embodiments to nevertheless obtain high efficiencies.

One embodiment of photovoltaic cell 800 has the following configuration: substrate 802 formed of glass, back contact layer 804 formed of molybdenum, solar absorber layer 806 formed of Copper Indium DiSelenide, heterojunction partner layer 808 formed of Zinc Oxide, buffer layer 810 formed of Zinc Oxide, interconnect layer 812 formed of doped Zinc Oxide, layer 814 formed of p-type amorphous Silicon, layer 816 formed of intrinsic amorphous Silicon, and layer 818 formed of n-type amorphous Silicon.

Figure 9:
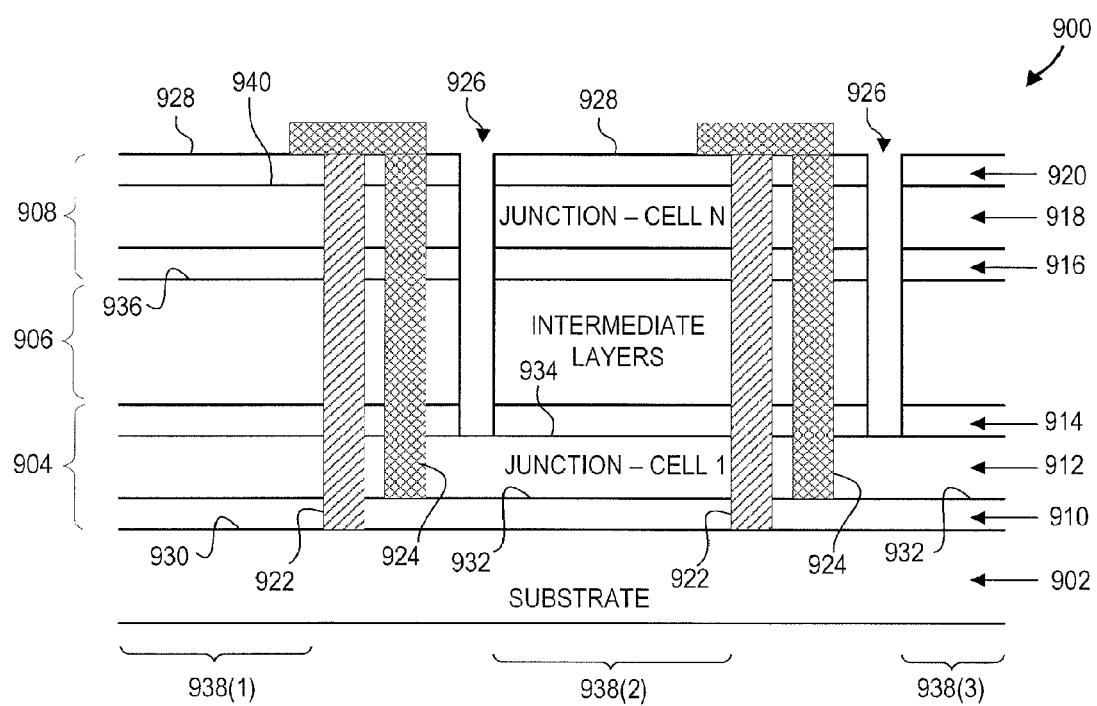
FIG. 9 is a cross sectional view of a plurality of multi-junction photovoltaic cells monolithically integrated onto a common substrate, in accordance with one embodiment.

As has been previously discussed, a plurality of the photovoltaic cells of the present disclosure may be monolithically integrated onto a common substrate. For example, several photovoltaic cells 200, 300, 400, 600, 700, or 800 may be monolithically integrated onto a common substrate. FIG. 9 is a cross sectional view of a plurality 900 of multi-junction photovoltaic cells 938 monolithically integrated onto a common substrate; such plurality of photovoltaic cells is an embodiment of module 100. FIG. 9 illustrates plurality 900 including three multi-junction photovoltaic cells 938(1), 938(2), and 938(3) (only parts of photovoltaic cells 938(1) and 938(3) are illustrated in FIG. 9); however, plurality 900 may include any number of photovoltaic cells 938 greater than 1. Each photovoltaic cell 938 includes N single-junction photovoltaic cells, where N is an integer that is greater than or equal to one. It should be noted that several photovoltaic cells 200, 300, 400, 600, 700, or 800 may be monolithically integrated onto a common substrate in manners different from that illustrated in FIG. 9.

Bottom single junction photovoltaic cells 904 are formed on substrate 902. Photovoltaic cells 904 include bottom contacts 910 (e.g., back contact layers formed of molybdenum) formed on substrate 902. Junctions 912 are formed on bottom contacts 910; junctions 912 each include, for example, a solar absorber layer and a heterojunction partner layer. Top contacts 914 are optionally formed on junctions 912; top contacts 914 includes at least one of a conductive top contact layer (e.g., doped Zinc Oxide, undoped Zinc Oxide, Indium Tin Oxide, doped Tin Oxide, undoped Tin Oxide, n-type amorphous Silicon, n-type amorphous Silicon Germanium, hydrogenated amorphous Silicon Carbide, and n-type microcrystalline amorphous Silicon) and a buffer layer.

One or more intermediate layers of single-junction photovoltaic cells (represented by reference character 906) are sequentially formed on bottom single-junction photovoltaic cells 904. The individual layers of single-junction photovoltaic cells 906 are not shown in FIG. 9 in order to promote illustrative clarity. It should be noted that if plurality 900 includes only two single-junction photovoltaic cell layers (904 and 908), intermediate single-junction photovoltaic cell layers 906 will not be included in plurality 900.

Top single junction photovoltaic cells 908 are formed on a top surface 936 of single junction photovoltaic cell layers 906 (or directly on bottom single-junction photovoltaic cells 904 if single junction photovoltaic cell layers 906 are not present). Similar to photovoltaic cells 904, photovoltaic cells 908 include bottom contacts 916 formed on top surface 936, junctions 918 formed on bottom contacts 916, and top contacts 920 formed on junctions 918. Junctions 918 may include, for example, N-I-P or P-I-N structures.

Scribes at least partially delineate each multi-junction photovoltaic cell 938. For example, FIG. 9 illustrates photovoltaic cells 938(1), 938(2), and 938(3) being at least partially defined by scribes. First isolation scribes 922 each extend from a top surface 928 of photovoltaic cells 908, or from a top surface 940 of junctions 918 (if top contacts 920 are sufficiently conductive), to a top surface 930 of substrate 902, or to a top surface of an insulator layer (not shown in FIG. 9) disposed on top surface 930. First isolation scribes 922 are filled with an insulating material. Connecting scribes 924 each extend from top surface 928 of photovoltaic cells 908, or from top surface 940 of junctions 918, to a top surface 932 of bottom contacts 910. Connecting scribes 924 are filled with a conductive material. If top contacts 920 are scribed, then the conductive material of each connecting scribe 924 extends over an adjacent first isolating scribe 922; accordingly, each connecting scribe 924 electrically connects a section of top surface 928 of one photovoltaic cell 938 to a bottom contact of an adjacent photovoltaic cell 938. Second isolating scribes 926 each extend from top surface 928 of photovoltaic cells 938 to a top surface 934 of a respective junction of a bottom single junction photovoltaic cell 904, provided the solar absorber of the bottom single junction photovoltaic cell is sufficiently resistive, otherwise second isolating scribe 926 may extend from top surface 928 to top surface 932 of bottom contacts 910. Second isolating scribes 926 are illustrated as being filled with air in FIG. 9, however, in other embodiments, isolating scribes 926 may be filled with another relatively non-conductive material.

P-Type Cadmium Selenide Absorber Layers

As deposited, Cadmium Selenide tends to be n-type. In many of the structures described herein, a p-type Cadmium Selenide layer is desired.

Figure 10:
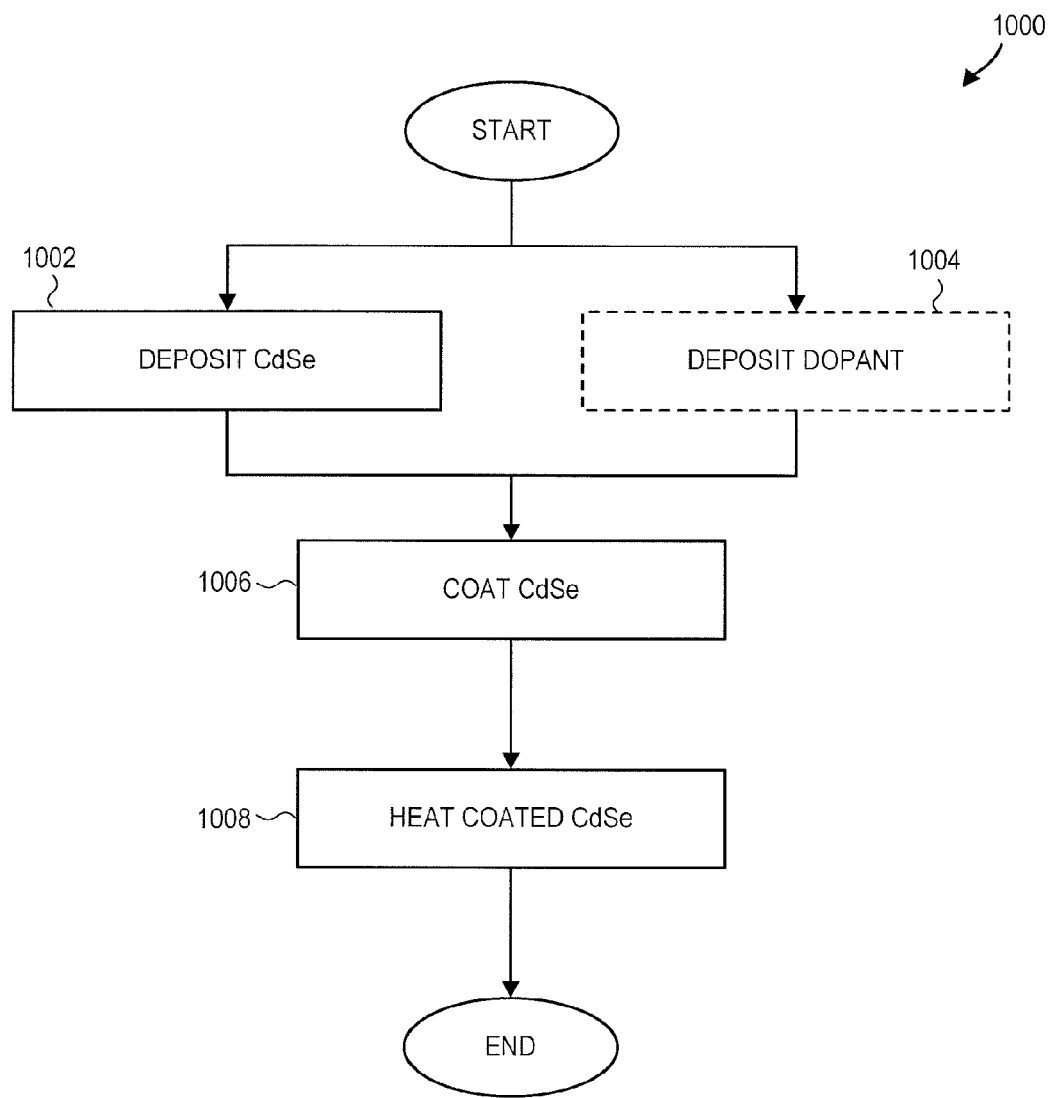
FIG. 10 shows one method of converting n-type Cadmium Selenide to p-type Cadmium Selenide, in accordance with one embodiment.

FIG. 10 shows one process 1000 of converting n-type Cadmium Selenide to p-type Cadmium Selenide. Process 1000 may enable use CdSe in structures and processes resembling those previously demonstrated in lower (1.5 electron volt) bandgap CdTe TFPV cells. Process 1000 also allows fabrication of a CdSe cell having a correct polarity for monolithic connection to an underlying p-type Cu(In, Ga, Al) (S, Se)$_2$ bottom cell. By a Cu(In, Ga, Al)(S, Se)$_2$, a material is meant that comprises Copper, at least one of Sulfur or Selenium, and at least one of Indium, Gallium, or Aluminum. For example, as discussed above, some embodiments of solar absorber layers 206 and 708 are formed of p-type CdSe, and process 1000 may be used to form such embodiments. As another example, process 1000 may be used to form the top CdSe solar absorber layers 1115 and 1216 of photovoltaic cells 1100 (FIGS. 11) and 1200 (FIG. 12), respectively. Furthermore, process 1000 may be used to provide p-type CdSe for use in applications other than photovoltaic cell solar absorber layers.

Process 1000 begins with step 1002 where a layer of Cadmium Selenide is deposited. An example of step 1002 is sputtering a layer of Cadmium Selenide on a photovoltaic cell's back contact layer. Optional step 1004 is performed concurrently with step 1002. In step 1004, a dopant is deposited concurrently with the layer of Cadmium Selenide to form a doped Cadmium Selenide layer. Some commonly known potential p-type dopants that can be used for group IIB-VIB materials include, for example, at least one of a Group IA element, a Group IB element, and a Group VB element. However the effectiveness of these dopants in highly compensated group IIB-VIB materials such as CdSe, is tenuous at best, especially if subsequent high-temperature processing of the CdSe is desired to improve the properties of the CdSe and subsequent device efficiency. In an embodiment, Group IIIB and a Group VIIB elements are used in step 1004. An example of step 1004 is depositing a Group IIIB elements, preferably lower cost elements such as Ga and Al, along with the layer of Cadmium Selenide.

In step 1006, the layer of Cadmium Selenide (which may include a dopant deposited in optional step 1004) is coated with a solution including a solvent (e.g., methanol) and at least one chloride selected from the group consisting of chlorides of Group IA elements, chlorides of Group IB elements, and chlorides of Group IIIB elements. Examples of such solution include a preferable $GaCl_2$ solution, a $CuCl_2$ solution, a mixed $CuCl_2$ and $GaCl_2$ solution, a mixed $CuCl_2$ and $CdCl_2$ solution, a mixed $GaCl_2$ and $CdCl_2$ solution, and a mixed $CuCl_2$, $GaCl_2$, $CdCl_2$ solution. An example of step 1006 is spin coating the layer of Cadmium Selenide with a solution of Gallium Chloride and methanol at a concentration of 0.1 to 0.00001 (preferably 0.001) Molar and allowing the coated layer to dry. As another example, the layer of Cadmium Selenide may be submersed in the solution and heated to 50 C-60 C for a period of 10 minutes to 20 minutes, then allowed to dry.

In step 1008, the coated layer of Cadmium Selenide is heated in an environment having an ambient temperature of between 300 and 500 degrees Celsius (preferably 400 degrees Celsius) for a time between three and thirty minutes in a manner which minimizes loss (evaporation) of Selenium from the layer of Cadmium Selenide. For example, the Cadmium Selenide may be heated in a Selenium containing environment or a Selenium enriched atmosphere. As another example, the two layers of Cadmium Selenide may be disposed such that their surfaces are touching or nearly touching to physically impede evaporation of Selenium from the layers' surfaces. As yet another example, a non-porous cap may be placed on the coated layer of Cadmium Selenide during heating to physically impede the evaporation of Selenium from the Cadmium Selenide.

It should be noted that execution of optional step 1004 may advantageously allow additional freedom in selection of chlorides and chloride concentrations used in step 1006. For example, if step 1004 is executed, step 1006 may be executed with the use of solely Cadmium Chloride as the chloride. Use of Cadmium Chloride may be advantageous because it may help to prevent erosion of Cadmium Selenide during the chloride treatment.

Figure 11:
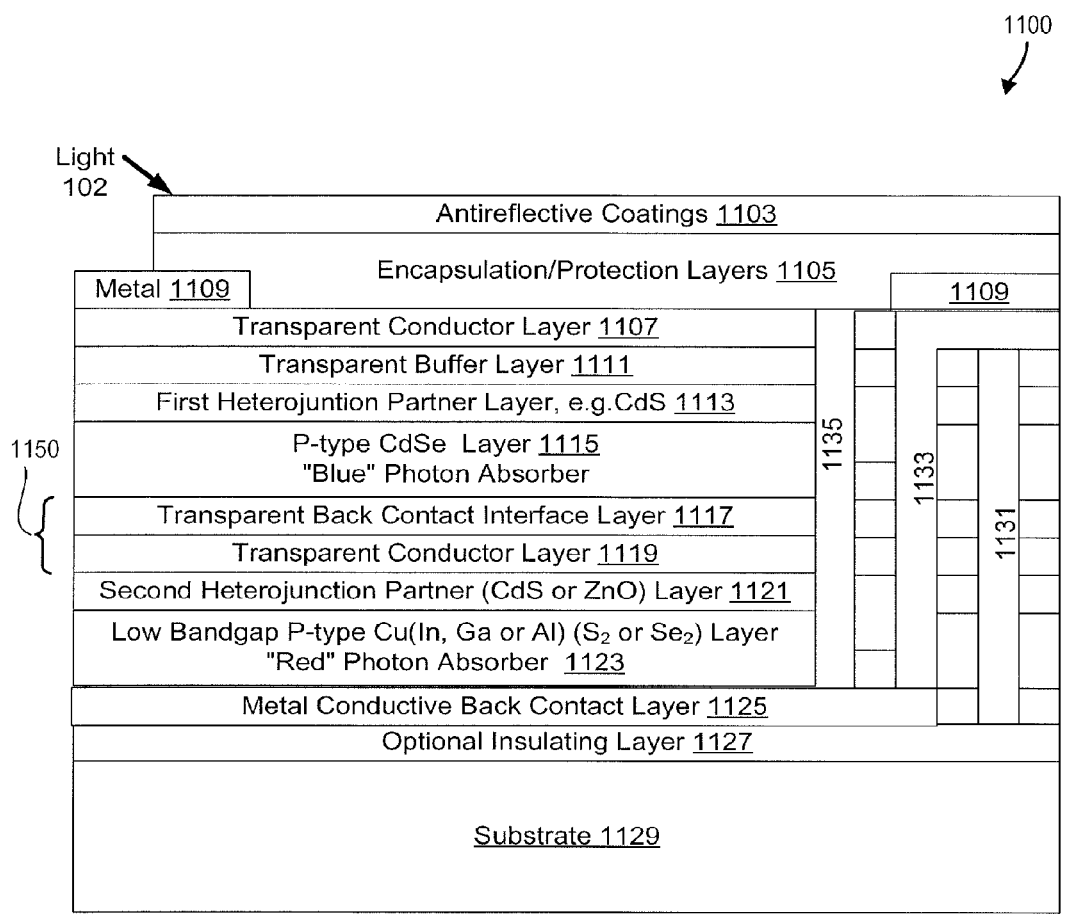
FIG. 11 is a cross sectional view of one two-junction photovoltaic cell, in accordance with one embodiment.
Figure 12:
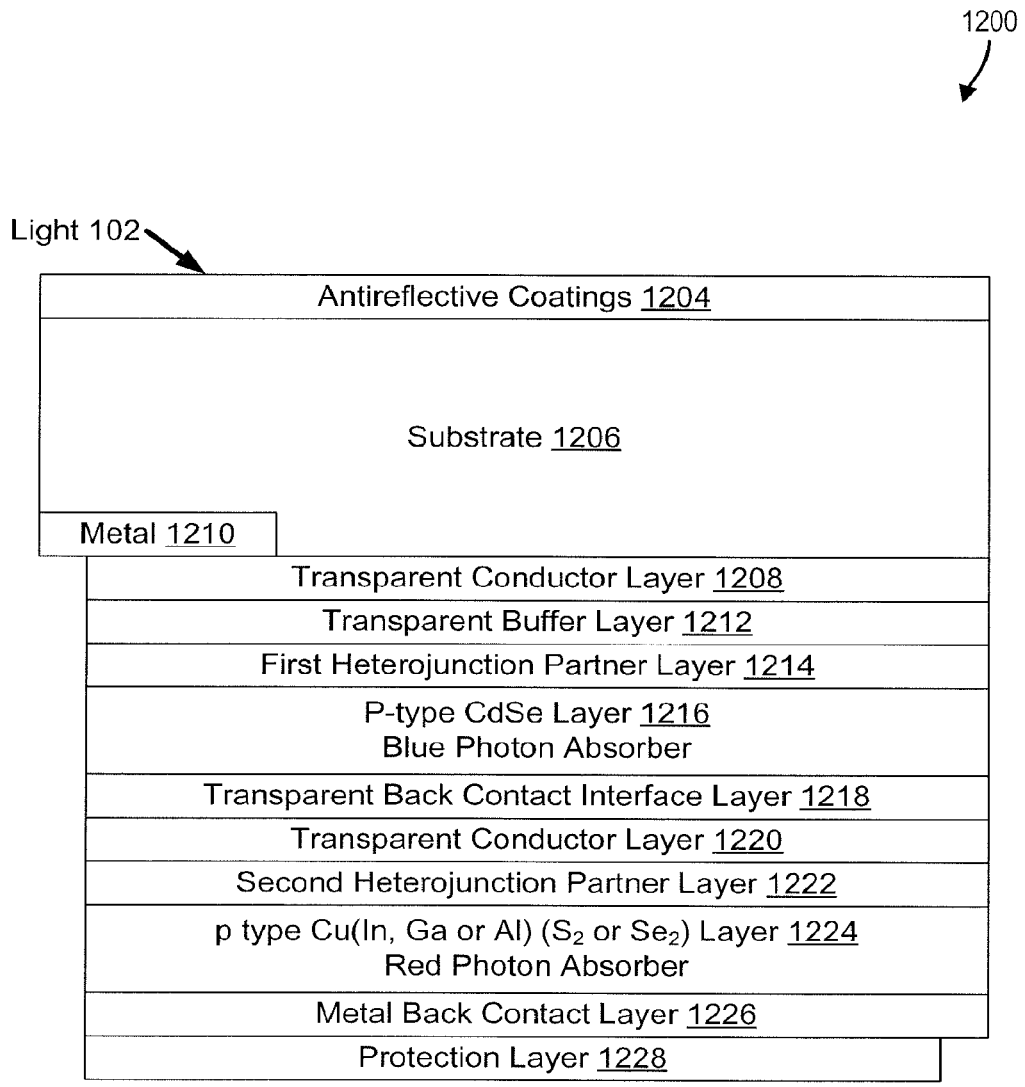
FIG. 12 is a cross sectional view of one two-junction photovoltaic cell, in accordance with one embodiment.

FIGS. 11 and 12 are cross sectional views of tandem photovoltaic cells 1100 and 1200, respectively. Each of photovoltaic cells 1100 and 1200 are an embodiment of photovoltaic cell 108 of FIG. 1 and include a top solar absorber layer optimized for absorbing short wavelength "blue" photons, defined as those photons having wavelengths shorter than red light. The top solar absorber layers of photovoltaic cells 1100 and 1200 are formed of p-type Cadmium Selenide having a wide bandgap of 1.72 electron-volts. Embodiments of photovoltaic cells 1100 and 1200 advantageously have potential to reach high efficiencies, possibly above twenty percent, and high specific power (potentially greater than 2,000 watts per kilogram) when built on lightweight flexible substrates.

The CdSe junction is fabricated on top of a high-efficiency, but lower-bandgap, thin film photovoltaic junction ("TFPV") bottom junction having a photon absorber layer of a IB-IIIB-VIB$_2$ material such as a Copper-Indium-DiSelenide and related alloys with Gallium, Aluminum or Sulfur having the approximate formula Cu(In, Ga, or Al) (S, or Se)$_2$. As another example, the bottom junction may be formed of Copper Indium Gallium Selenide.

In photovoltaic cells 1100 and 1200, the CdSe top cell absorbs light toward the blue end of the spectrum, transmitting unabsorbed light for absorption by the underlying Cu(In, Ga, Al) (S, Se)$_2$ cell. The CdSe layers of photovoltaic cells 1100 and 1200 are, for example, fabricated using an embodiment of process 1000, FIG. 10.

Structure of Photovoltaic Cell 1100:

With reference to FIG. 11, incident light 102 approaches the illuminated side of photovoltaic cell 1100. Photovoltaic cell 1100 then has layers as follows.

Antireflective Coatings layer 1103 forms the top of photovoltaic cell 1100. This layer, which may include several sub-layers, serves to impedance-match incoming light 102 to underlying layers of photovoltaic cell 1100 to enhance efficiency by avoiding loss of incident photons to reflection. Layer 1103 admits light to photovoltaic cell 1100. Additional antireflective layers may also be used between other layers of photovoltaic cell 1100 having different indexes of refraction, such as between encapsulation/protection layer 1105 and transparent conductor layer 1107.

Encapsulation/Protection layer 1105 is disposed below layer 1103. Layer 1105 is a layer of a transparent material intended to provide mechanical and/or chemical protection to photovoltaic cell 1100. Layer 1105 may include one or more polymers such as polyimides or silicones, or may include a sputter-deposited metal oxide layer or a transparent glass such as Silicon Dioxide.

Metal collection grid 1109 is disposed on transparent conductor layer 1107 as shown in FIG. 11. This layer is optional. This layer or layers aid the lateral conduction to the cell terminals and is patterned so as to cover only a small percentage of the surface of photovoltaic cell 1100 while providing low resistance interconnection to transparent conductor layer 1107. Collection grid 1109 collects electrical power from the transparent conductor layer 1107 and conducts it to terminals of photovoltaic cell 1100. The collection grid 1109 and bottom collection or back contact layers 1125 may be patterned, and may contact each other at selected locations as known in the photovoltaic art, to electrically connect cells serially on the same substrate to obtain higher output voltages than those available from a single pair of junctions. Typical metal collection grids are multilayers, with the first layer being an adhesion and/or diffusion barrier layer, such as nickel or titanium, and another layer for conduction, such as aluminum or silver. Additional conducive layers may be used on top of the conduction layer, such as a layer of nickel.

A transparent conductor layer 1107 is disposed below encapsulation/protection layer 1105. Conductor layer 1107 is, for example, a single layer of doped Tin Oxide, doped Zinc Oxide, or an Indium Tin Oxide compound. Conductor layer 1107 is thin, transparent, and conductive. It serves to carry current from the top cell to the metal collection grid 1109. Optionally, a transparent buffer layer 1111 may be included. For example, conductor layer 1107 may be formed of relatively conductive material (e.g., Indium Tin Oxide) and buffer layer 1111 may be used and formed of a less conductive material, such as undoped Zinc Oxide.

An n-type heterojunction partner layer or window layer 1113 is disposed below conductor layer 1107 (or buffer layer 1111 if present). Heterojunction partner layer 1113 is, for example, Cadmium Sulfide (CdS). As another example, heterojunction partner layer 1113 may be formed of one of Indium Selenide, Zinc Selenide, Cadmium Zinc Selenide, Cadmium Selenide, Zinc Sulfide, Cadmium Oxide, Zinc Oxide, Zinc Magnesium Oxide, Tin Oxide, and Cadmium Zinc Sulfide. Heterojunction partner layer 1113 layer helps form the PN junction with the underlying CdSe layer 1115 which directs carriers generated by absorbed photons. Alternatively, heterojunction partner layer 1113 may be omitted if conductor layer 1107 is used in combination with a buffer layer 1111, such as with buffer layer 1111 formed of undoped Zinc Oxide, undoped Zinc Magnesium Oxide, or undoped Tin Oxide.

A Cadmium Selenide (CdSe) layer 1115 is disposed below heterojunction partner layer 1113. CdSe layer 1115 has been deposited as p-type, or converted to p-type, by post-treatment diffusion of a dopant, or by use of a process such as process 1000 of FIG. 10. P-type CdSe layer 1115 absorbs photons toward the blue end of the solar spectrum.

A transparent interconnect layer 1150 is disposed below CdSe layer 1115. Interconnect layer 1150 may be a bilayer and therefore include two layers—back contact interface layer 1117 and conductor layer 1119—as shown in FIG. 11. Alternately, interconnect layer 1150 may be formed of a single layer. For example, interconnect layer 1150 may be formed of a single layer of one of doped Tin Oxide, doped Zinc Oxide, or Indium Tin Oxide. As another example, interconnect layer 1150 may include interface layer 1117 (e.g., formed of doped Zinc Telluride), and conductor layer 1119 formed of a conductive oxide. Interconnect layer 1150 serves as a back contact for the top photovoltaic junction.

An n-type second heterojunction partner layer 1121 is disposed below interconnect layer 1150. Second heterojunction partner layer 1121 is, for example, one of Indium Selenide, Zinc Sulfide, Zinc Selenide, Cadmium Sulfide, Cadmium Zinc Sulfide, Zinc Oxide, or Zinc Magnesium Oxide. Second heterojunction partner layer 1121 helps to form a junction with layer 1123.

A p-type solar absorber layer 1123 is disposed below second heterojunction interconnect layer 1121. Solar absorber layer 1123 is formed of a group IB-IIIB-VIB$_2$ semiconductor such as Copper Indium DiSelenide, to form a low bandgap solar absorber, or a related alloy Cu(In, Ga, Al) (S, Se)$_2$ to optimize the bandgap and tandem device performance. In a particular embodiment, layer 1123 is CuInSe$_2$.

A metal back contact and current collection layer 1125 is disposed below solar absorber layer 1123. Layer 1125 is, for example, formed of Molybdenum metal.

An optional layer 1127 of insulation may be disposed between back contact layer 1125 and substrate 1129. Insulating layer 1127 is used, for example, when substrate 1129 is a conductive metal foil. Insulating layer 1127 is formed, for example, of an undoped oxide or a polymeric material such as a silicone or polyimide.

A substrate layer 1129 is disposed below back contact layer 1125 (or insulating layer 1127 if present). Substrate layer 1129 is, for example, metal foil, insulated metal foil, glass, or a heat-stable polymer such as polyimide or reinforced silicone.

One embodiment of photovoltaic cell 1100 has the following configuration: substrate 1129 formed of polyimide, no insulating layer 1127, back contact layer 1125 formed of Molybdenum, solar absorber layer 1123 formed of Copper Indium DiSelenide, second heterojunction partner layer 1121 formed of Zinc Oxide, transparent conductor layer 1119 formed of Indium Tin Oxide, back contact interface layer 1117 formed of doped Zinc Telluride, solar absorber layer 1115 formed of p-type Cadmium Selenide, first heterojunction partner layer 1113 formed of Cadmium Sulfide, buffer layer 1111 formed of undoped Tin Oxide, transparent conductor layer 1107 formed of doped Tin Oxide, metallic grid 1109 formed of silver on a nickel adhesion layer, layer 1105 formed of Silicon Oxide, and antireflective coatings 1103 formed of Magnesium Flouride.

Structure of Photovoltaic Cell 1200:

In photovoltaic cell 1200 (FIG. 12), a transparent substrate 1206 is used. Photovoltaic cell 1200 is an alternate embodiment of photovoltaic cell 1100 (FIG. 11). In photovoltaic cell 1200, incident light 102 enters through an antireflection coating layer 1204 into the substrate 1206. Light then passes through gaps in the optional collection grid metal 1210 and through transparent conductor layer 1208. Transparent conductor layer 1208 may have a buffer layer 1212 as heretofore described with 1107 and 1111 of photovoltaic cell 1100 (FIG. 11).

Light passes from the transparent conductor layer 1208 (and buffer layer 1212 if present) and through a first heterojunction partner layer 1214 into the p-type CdSe absorber layer 1216 of the top junction. In layer 1216, photons toward the blue end of the solar spectrum are absorbed, but photons toward the red end of the solar spectrum mostly pass through a back contact interface layer 1218 and a second transparent conductor layer 1220 into the bottom junction. (It should be noted that photovoltaic cell 1200 need not include both back contact interface layer 1218 and conductor layer 1220. If both back contact interface layer 1218 and conductor layer 1220 are present, they may be collectively referred to as a bilayer.) The bottom junction has a heterojunction partner layer 1222 of Cadmium Sulfide, Zinc Sulfide, Cadmium Zinc Sulfide, Zinc Oxide, or Zinc Magnesium Oxide in contact with a low bandgap p-type group IB-IIIB-VIB$_2$ semiconductor layer 1224 such as the Cu(In, Ga, Al) (S, Se)$_2$ material previously discussed. The transmitted light is absorbed in this p-type layer 1224.

A metallic back contact layer 1226, preferably of molybdenum metal, serves as an electrical back contact to photovoltaic cell 1200. Finally, a protective passivation coating or backing material 1228, which need not be transparent, protects photovoltaic cell 1200. The various layers are patterned as needed using a series of scribes or, alternatively photoetching, to expose the metallic grid layer 1210 and back contact layer 1226 for connection of leads to the device, to isolate particular areas of the device as individual cells, and to electrically connect individual cells in series to provide higher voltage output than attainable from a single tandem-junction pair.

One embodiment of photovoltaic cell 1200 has the following configuration: back contact layer 1226 formed of Molybdenum, solar absorber layer 1224 formed of Copper Indium DiSelenide, second heterojunction partner layer 1222 formed of Zinc Oxide, transparent conductor layer 1220 formed of Indium Tin Oxide, transparent back contact layer 1218 formed of p-type Zinc Telluride, solar absorber layer 1216 formed of Cadmium Selenide, first heterojunction partner layer 1214 formed of undoped Tin Oxide, buffer layer 1212 formed of undoped Tin Oxide, transparent conductor layer 1208 formed of doped Tin Oxide, no grid 1210, substrate 1206 formed of glass, and antireflective coatings 1204 formed of Magnesium Flouride.

Figure 13:
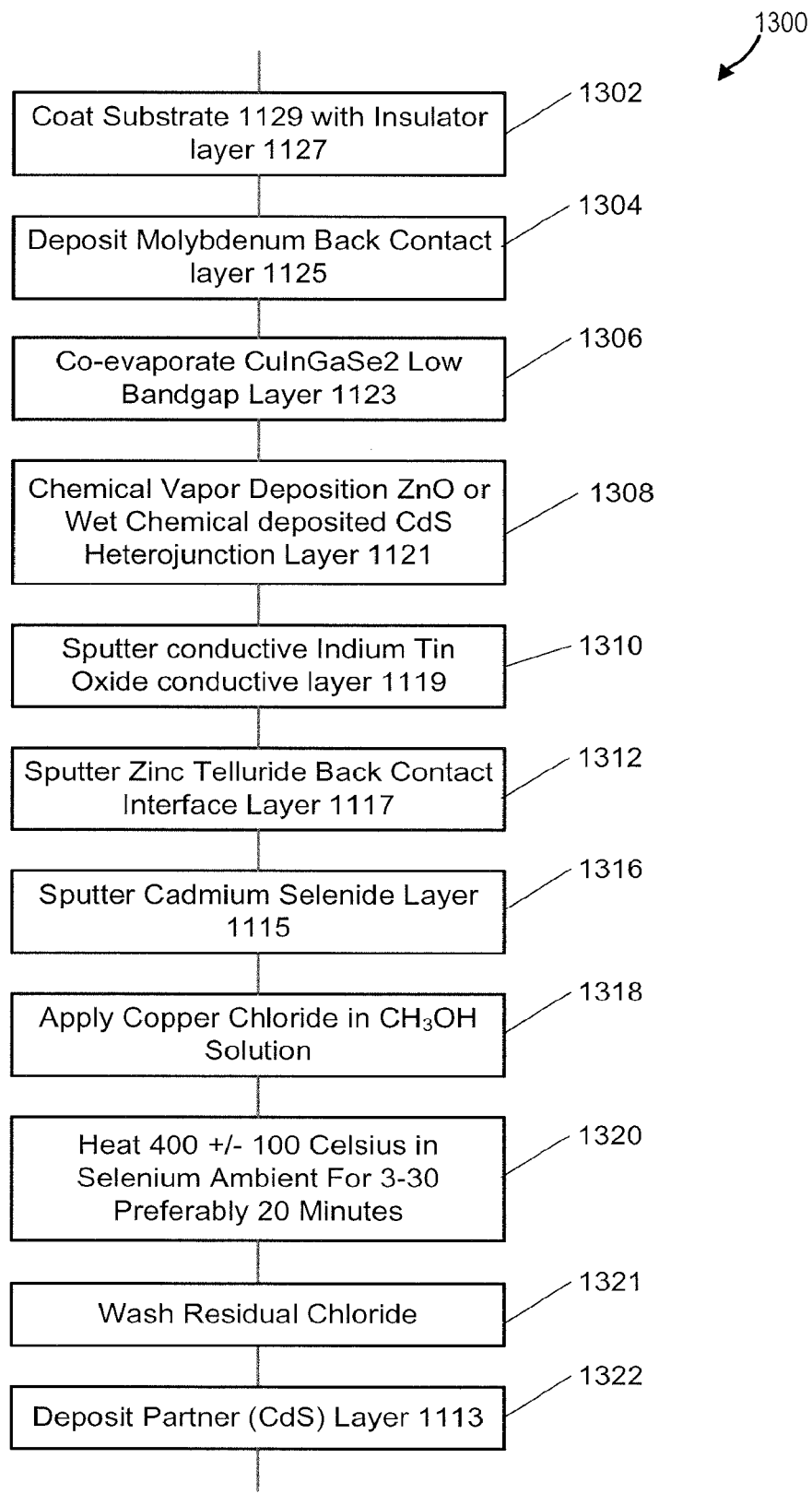
FIGS. 13 and 14 show one method of fabricating the photovoltaic cell of FIG. 11, in accordance with one embodiment.
Figure 14:
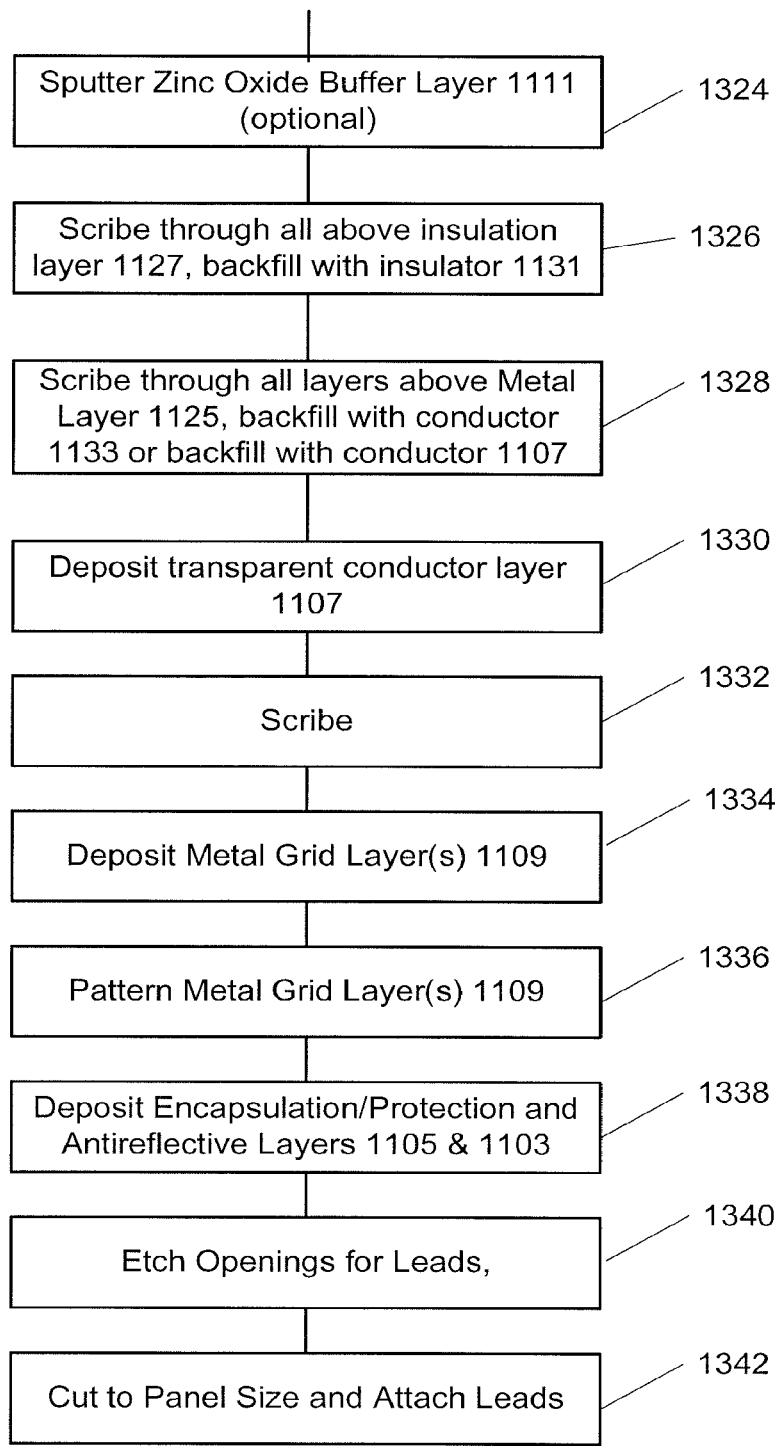

Fabrication of Photovoltaic Cells 1100:

Method 1300 of FIGS. 13 and 14 may be used to fabricate photovoltaic cell 1100 of FIG. 11. However, it should be noted that photovoltaic cell 1100 might be fabricated using a different method.

Method 1300 may make use conventional sputtering or of roll-to-roll sputter processing, as known in the art and described in U.S. Pat. No. 6,783,640, for deposition of most layers. A disclosure of a conventional sputtering process for thin-film photovoltaic devices using similar materials is contained in U.S. Pat. No. 5,393,675 to Compaan, which is hereby incorporated by reference. For this discussion, a flexible metal strip is assumed for substrate 1129, although, as previously stated, other substrates are usable.

First, the metal substrate 1129 is coated 1302 with insulator layer 1127. For the following deposition steps, the substrate is loaded into a suitable sputtering machine with a target chosen to give the desired composition of each layer, and deposition performed as known in the art.

While RF sputter deposition is preferred for most layers, as it can be used with a wide variety of materials, alternative thin-film deposition methods may be used for some layers. Alternative thin-film deposition methods that may be suitable for some layers include evaporation, printing, pulsed laser deposition, close-space sublimation, electro-chemical deposition, chemical vapor deposition, wet chemical processing and molecular beam epitaxy.

Metal back contact layer 1125, preferably Molybdenum, is deposited 1304, following which the p-type Cu(In, Ga or Al) ($S_2$ or $Se_2$) low bandgap solar absorber layer 1123 is deposited preferably using a co-evaporation process 1306. Solar absorber layer 1123 is then topped with a high-resistivity Zinc-Oxide partner layer 1121, deposited 1308 preferably using chemical vapor deposition.

Next is sputter deposited 1310, 1312 conductor layer 1119 and back contact interface layer 1117, respectively. Conductor layer 1119 is, for example, Indium Tin Oxide. Back contact interface layer 1117 is preferably Cu doped ZnTe or is optionally nitrogen doped per the method described by Compaan et al, contained in U.S. Pat. No. 6,852,614, which is hereby incorporated herein by reference.

Next, a layer 1115 of Cadmium Selenide (CdSe) is deposited 1316, preferably by sputtering, but alternatively this layer can be deposited via any of the known deposition techniques used for II-VI materials. Some common thin-film deposition techniques of II-VI materials include but are not limited to: RF sputtering, evaporation, printing, pulsed laser deposition, close-space sublimation, electro-chemical deposition, wet chemical processing, chemical vapor deposition, or molecular beam epitaxy.

The CdSe is then made p-type by a high-temperature chloride process that includes coating the CdSe with a solution including at least one chloride selected from the following: chlorides of Group IA elements, chlorides of Group IB elements, and chlorides of group IIIB elements. Examples of chlorides that may be used include, but are not limited to, Copper Chloride ($CuCl_2$), and/or Gallium Chloride ($GaCl_2$) with optional Cadmium Chloride ($CdCl_2$). The chloride coated CdSe is then heated, as discussed below, while at least partially preventing the evaporation of Selenium from the chloride coated CdSe.

For example, the CdSe may be made p-type as follows. Following the deposition 1316 of the doped or undoped CdSe layer, a wet $GaCl_2$ solution (with optional $CuCl_2$ and $CdCl_2$) is applied 1318 uniformly to the surface of the CdSe film. In one embodiment, the $GaCl_2$ is mixed in methanol ($CH_3OH$) at a concentration of 0.1 to 0.00001 (preferably 0.001) M. The solution is deposited on the CdSe surface via spin coating to uniformly distribute the solution across the CdSe surface. The volume of solution is preferably 0.04 ml per $cm^2$ of CdSe surface. Alternatively, the solution may be drop coat and knife "doctor" bladed across the CdSe surface. Alternatively, the solution may be sprayed or misted uniformly onto the CdSe surface. Alternatively, the chlorides may be deposited using a dry technique, such as chemical vapor deposition. Alternatively, the chlorides may be deposited from submersion in a heated chloride bath.

After applying 1318 the solution, the solution is allowed to dry on the CdSe surface, leaving the dried chloride on the surface. The CdSe and dried chloride are then placed into a chamber and heated 1320 in an environment having an ambient temperature in the range of 300 to 500° C., preferably 390 C for a time ranging from a three minutes to 30 minutes, preferably 20 minutes, with a strong selenium-containing background gas supplied immediately adjacent to the CdSe surface. The Selenium background gas helps prevent the evaporation of Selenium from the coated layer of CdSe. Alternately, instead of using a Selenium background, the evaporation of Selenium from the coated layer of CdSe may be physically impeded, such as by used of a non-porous cap on the CdSe layer, or by placing two or more layers of CdSe together or nearly touching. When a non-porous cap layer is used on the CdSe layer to impede evaporation of the selenium, this cap layer may be removed after the heating step, and need not remain as a permanent part of the photovoltaic cell.

In one embodiment, the selenium ambient may be provided via evaporation with the Se source in close proximity (within 12 inches) and directed at the CdSe surface. Alternatively, the Se is provided by passing the CdSe over a heated Se source plate for close-space sublimation of the Se to the CdSe surface in a background gas of air, Ar, $O_2$, or $N_2$. The concentrated Se ambient above the surface of the CdSe suppresses the loss of Selenium vapor from the surface during the high-temperature treatment. The high-temperature chloride treatment modifies the CdSe electronic and optical properties, making it suitable as a p-type solar absorber layer. Residual chloride is removed by washing 1321 with methanol.

Next, the heterojunction partner layer 1113 is deposited 1322, preferably CdS by wet chemical processing on the now-p-type CdSe layer 1115. In an alternative embodiment, the high-temperature treatment with $CdCl_2$, and/or $CuCl_2$ and/or $GaCl_2$ described previously, is performed after the deposition of this layer. In yet another alternate embodiment a second high-temperature treatment is performed using $CdCl_2$ only after the deposition of the CdS layer. In yet another alternative embodiment, no n-type heterojunction partner layer is used to form the junction—the heterojunction partner layer is replaced by an undoped oxide layer, buffer layer 1111 such as Tin Oxide, Zinc Oxide, or Zinc Magnesium Oxide, and the transparent conductor layer 1107.

Following the heterojunction partner layer deposition, the optional undoped oxide buffer layer 1111, such as Tin Oxide is deposited 1324 in some embodiments by sputtering.

Next, the photovoltaic cell 1100 is patterned. This may be performed by scribing as known in the art. Scribing may be performed by laser, mechanical scribing, roll print or photo etch with dry or wet etching, or other methods of selective removal of material from the photovoltaic device surface. A deep isolation scribing 1326 cuts a trench by selectively removing all layers above insulation layer 1127 in an isolation trench, and backfills the resulting trench with insulation 1131, such as a non-conductive ink or oxide. A second contact scribing 1328 cuts a trench by selectively removing all layers above metal layer 1125, with the resulting trench backfilled with a conductive material 1133, such a conductive ink or oxide, which may be the next deposited conductor layer 1107. The contact scribe thereby connects metal layer 1125 in particular predetermined areas to transparent conductor layer 1107 to connect individual cells in series to obtain high voltage output.

Next, Indium Tin Oxide transparent conductor layer 1107 is deposited 1330, preferably by sputtering.

An interconnect scribing 1332 is performed to remove at least the transparent conductor layer 1107 in a trench 1135 between individual cells. This trench 1135 may be left empty or backfilled with an insulator.

The metal collection grid 1109 is next deposited 1334, if used, and patterned 1336 so it covers only a specific portion or pattern on the surface. This layer, when finished, occupies only a small percentage of the cell so as to admit light to the absorbing layers beneath it.

Next, encapsulation/protection layer 1105 and antireflective coating 1103 layer are deposited 1338. Then, openings are etched 1340 in the encapsulation/protection and antireflective coating layers so that leads may be attached 1342 and the device is cut into finished devices.

Figure 15:
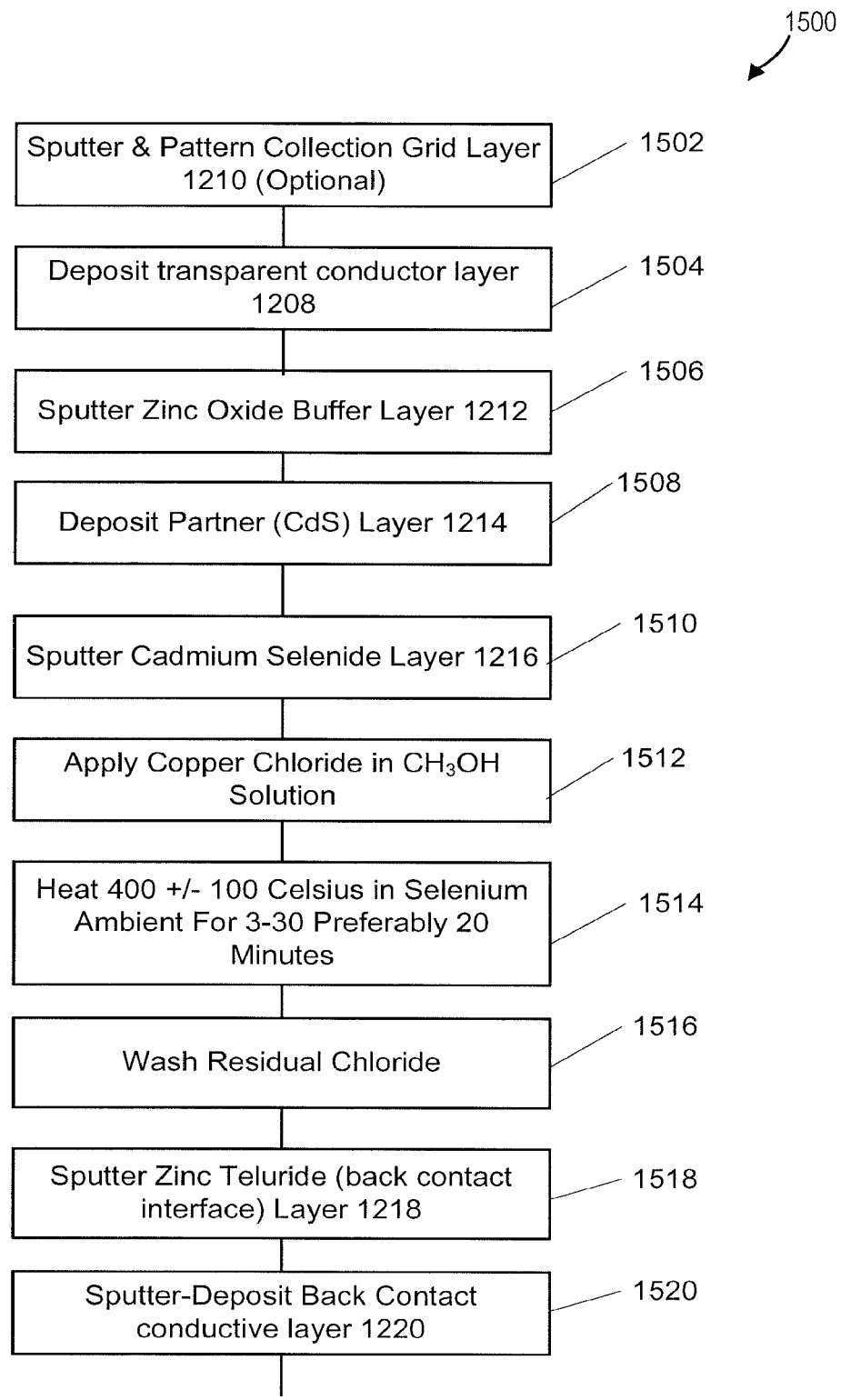
FIGS. 15 and 16 show one method of fabricating the photovoltaic cell of FIG. 12, in accordance with one embodiment.
Figure 16:
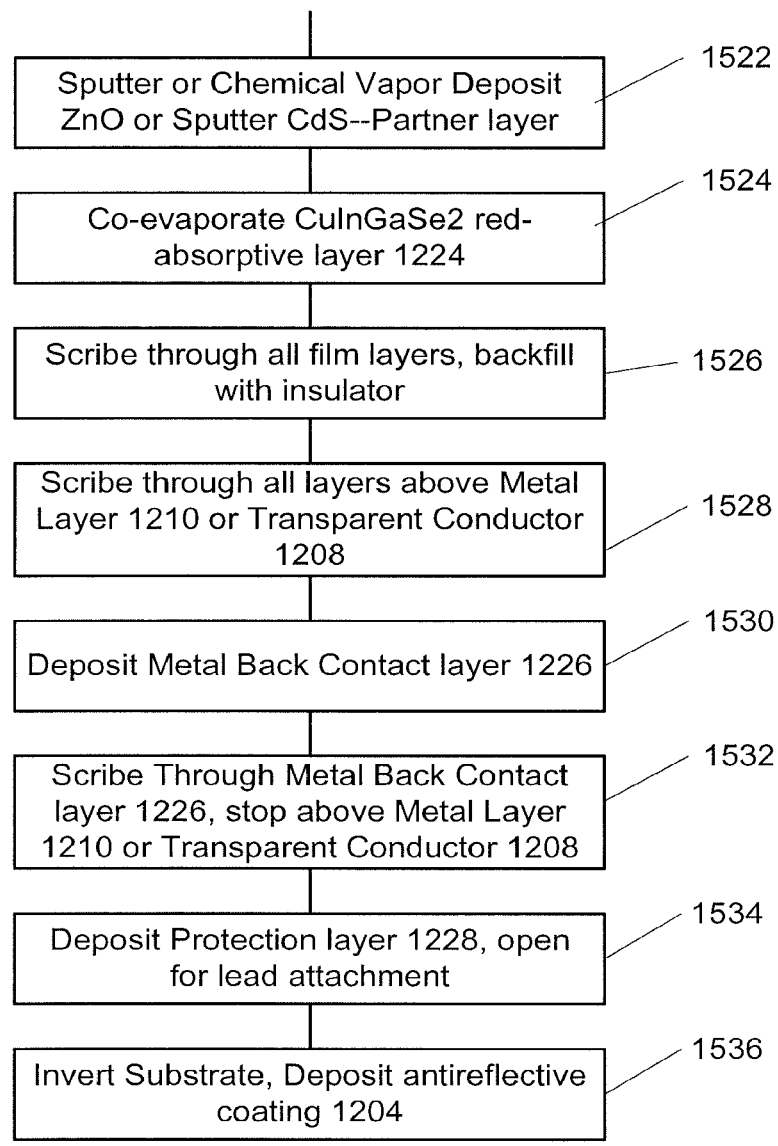

Fabrication of Photovoltaic Cells 1200:

FIGS. 15-16 illustrate a method 1500 fabricating photovoltaic cell 1200 of FIG. 12. Method 1500 is an embodiment of method 1300 of FIGS. 13-14. It should be noted that photovoltaic cell 1200 may be fabricated using methods other than method 1500.

Method 1500 begins with deposition 1502 and patterning of the optional collection grid 1210 on a transparent substrate 1206. Following patterning of this layer, a transparent conductor layer 1208 is deposited 1504, preferably Indium Tin Oxide but alternatively transparent conductors such as doped Tin Oxide ($SnO_2$), and doped Zinc Oxide (ZnO) may be used. Conductor layer 1208 is deposited by sputter deposition and is thin, transparent, and conductive. It serves to carry current from the top cell to the metal collection grid 1210. Optionally, buffer layer 1212 may be sputtered 1506. Buffer layer 1212 is, for example, undoped Zinc Oxide or undoped Tin Oxide.

Next, a heterojunction partner layer 1214, preferably of CdS, is deposited 1508, preferably by wet chemical processing although other deposition methods known in the art such as sputtering may be used. Following this, a layer of CdSe 1216 is deposited, preferably by sputtering 1510.

The CdSe is then made p-type by a high-temperature chloride process that includes coating CdSe layer 1216 with a solution including at least one chloride selected from the following chlorides: chlorides of Group IA elements, chlorides of Group IB elements, and chlorides of Group IIIB elements. Examples of solutions that may be used to coat CdSe layer 1216 include, but are not limited to, Copper Chloride ($CuCl_2$), and/or Gallium Chloride ($GaCl_2$) with optional Cadmium Chloride ($CdCl_2$). The coated CdSe layer 1216 is subsequently heated while at least partially preventing the evaporation of Selenium from the coated CdSe layer 1216. For example, the coated CdSe layer may be heated in a Selenium environment.

The following is one example of how CdSe layer 1216 may be made p-type. Following the deposition 1510 of the doped or undoped CdSe layer, a wet $GaCl_2$ solution (with optional $CuCl_2$ and $CdCl_2$) is applied 1512 uniformly to the surface of the CdSe film. In one embodiment, the $GaCl_2$ is mixed in methanol ($CH_3OH$) at a concentration of 0.1 to 0.00001 (preferably 0.001) Molar. The solution is deposited on the CdSe surface via spin coating to uniformly distribute the solution across the CdSe surface. The volume of solution is preferably 0.04 ml per $cm^2$ of CdSe surface. Alternatively the solution may be drop coat and knife "doctor" bladed across the CdSe surface. Alternatively, the solution may be sprayed or misted uniformly onto the CdSe surface. Alternatively, the chloride is applied by chemical vapor deposition (CVD). Alternatively, the chlorides may be deposited from submersion in a heated chloride bath.

After applying 1512 the solution, the solution is allowed to dry on the CdSe surface, leaving the chloride on the surface. The device, including the CdSe film coated with dried chloride, is then placed into a chamber and heated 1514 in an environment having an ambient temperature ranging from 300 to 500° C., preferably 390 C for a time ranging from a three minutes to 30 minutes, preferably 20 minutes, with a strong Selenium containing background gas environment supplied immediately adjacent to the CdSe surface to prevent evaporation of Selenium from the CdSe surface. As an alternative to providing a CdSe environment, evaporation of Selenium from the CdSe surface may be physically impeded, such as by placing two of more layers of CdSe such that their surfaces touch, or nearly touch, or by placing a non-porous cap on the CdSe layer. In one embodiment, the Selenium ambient may be provided via evaporation with the Se source in close proximity (within 12 inches) and directed at the CdSe surface. Alternatively, the Se is provided by passing the CdSe over a heated Se source plate for close-space sublimation of the Se to the CdSe surface in a background gas of air, Ar, $O_2$, or $N_2$. The concentrated Se ambient above the surface of the CdSe suppresses evaporative loss of Se from the surface during the high-temperature treatment. The high-temperature chloride treatment modifies the CdSe electronic and optical properties, making it suitable as a p-type solar absorber layer. Residual chloride is removed by washing 1516 with methanol.

Next is sputter deposited 1518 a transparent conductor interface layer 1218. This is ZnTe with optional Cu doping or with optional nitrogen doping per the method described by Compaan et al, contained in U.S. Pat. No. 6,852,614. Next, a conductive back contact layer 1220, preferably a doped Tin Oxide or an Indium Tin oxide layer, is deposited 1520.

Next, the red-optimized photovoltaic junction is formed. To do this, processing continues with deposition 1522 of a high-resistivity Zinc-Oxide heterojunction partner layer 1222 is deposited by sputtering, or chemical vapor deposition. Then, the p-type Cu(In, Ga or Al) ($S_2$ or $Se_2$) low bandgap solar absorber layer 1224 is deposited, preferably using co-evaporation 1524.

Next, some patterning steps are performed to separate the device into several separate photovoltaic cells that can be strung together in series to obtain higher voltage output than available with a single hybrid stack. A first isolation scribeline 1526 cuts through all layers (excluding substrate 1206 and antireflective coatings 1204) and is backfilled with insulator, such as a non-conductive ink or oxide. A second contact scribeline 1528 cuts through all layers above (excluding substrate 1206 and antireflective coatings 1204), but stops at transparent conductor layer 1208 so as to permit contact to be made to, either the transparent conductor layer 1208 or the collection grid layer 1210.

Back contact metal layer 1226 is then deposited 1530. A third isolation scribeline 1532 is performed that cuts through back contact 1226 but stops above transparent conductor layer 1208 or collection grid layer 1210. The cell is then finished by depositing 1534 protection layers 1228, with openings in this layer for lead attachment; and depositing 1536 an antireflective coating 1204 on the opposite, illuminated, side of the substrate 1206.

For purposes of this document, the term blue includes wavelengths that are shorter than those of red light, including some red light but predominately yellow through the blue end of the spectrum, including ultraviolet light, but may also contain some absorption of the entire visible spectrum. Similarly, the term red includes wavelengths that are predominately near the red end of the spectrum including infrared.

While the top, blue-optimized, cell of photovoltaic cells 1100 and 1200 is largely transparent to red and infrared light, it may absorb small amounts of red and infrared light because of defects and impurities. The bottom, red-optimized, cell may also absorb some short wavelength light, including blue light, that escapes absorption in the top cell.

Similarly, when a layer is described as transparent, it need transmit a majority of light incident at appropriate angles; it may absorb, scatter, and reflect small amounts of light.

Changes may be made in the above methods and systems without departing from the scope hereof. It should thus be noted that the matter contained in the above description or shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A method of making a p-type Cadmium Selenide semiconductor material, comprising:
   depositing a layer of Cadmium Selenide;
   coating the layer of Cadmium Selenide with a solution comprising a solvent and at least one of chloride selected from the group consisting of chlorides of Group IA elements, chlorides of group IB elements, and chlorides of Group IIIB elements; and
   heating the layer of Cadmium Selenide in an environment having an ambient temperature of between 300 and 500 degrees Celsius for a time between three and thirty minutes while at least partially preventing the evaporation of Selenium from the layer of Cadmium Selenide.

2. The method of claim 1, wherein Selenium is at least partially prevented from evaporating from the layer of Cadmium Selenide during the step of heating by executing the step of heating in a Selenium enriched atmosphere.

3. The method of claim 1, wherein Selenium is at least partially prevented from evaporating from the layer of Cadmium Selenide during the step of heating by physically impeding the evaporation of Selenium from the layer of Cadmium Selenide.

4. The method of claim 1, wherein the solution comprises Copper Chloride and a solvent.

5. The method of claim 1, wherein the solution comprises Gallium Chloride and a solvent.

6. The method of claim 1, wherein the solution comprises Copper Chloride, Gallium Chloride, and a solvent.

7. The method of claim 1, wherein the solution further comprises Cadmium Chloride.

8. A method of making a photovoltaic device, comprising:
   depositing a contact layer;
   depositing a layer of Cadmium Selenide;
   coating the layer of Cadmium Selenide with a solution comprising a solvent and at least one of chloride selected from the group consisting of chlorides of Group IA elements, chlorides of group IB elements, and chlorides of Group IIIB elements;
   heating the layer of Cadmium Selenide in an environment having an ambient temperature of between 300 and 500 degrees Celsius for a time between three and thirty minutes while at least partially preventing the evaporation of Selenium from the layer of Cadmium Selenide;
   depositing a heterojunction partner layer; and
   depositing a transparent conductor layer.

9. The method of claim 8, wherein Selenium is at least partially prevented from evaporating from the layer of Cadmium Selenide during the step of heating by executing the step of heating in a Selenium enriched atmosphere.

10. The method of claim 8, wherein Selenium is at least partially prevented from evaporating from the layer of Cadmium Selenide during the step of heating by physically impeding the evaporation of Selenium from the layer of Cadmium Selenide.

11. The method of claim 8, wherein the solution comprises Copper Chloride and a solvent.

12. The method of claim 8, wherein the solution comprises Gallium Chloride and a solvent.

13. The method of claim 8, wherein the solution comprises Copper Chloride, Gallium Chloride, and a solvent.

14. The method of claim 8, wherein the solution further comprises Cadmium Chloride.

15. The method of claim 8, wherein the heterojunction partner layer is a material selected from the group consisting of Zinc Selenide, Cadmium Sulfide, Cadmium Zinc Selenide, Cadmium Selenide, Zinc Sulfide, Cadmium Oxide, Zinc Oxide, Zinc Magnesium Oxide, Tin Oxide, and Cadmium Zinc Sulfide.

16. The method of claim 8, further comprising depositing an undoped buffer layer between the heterojunction partner layer and the transparent conductor layer.

17. The method of claim 8, wherein the contact layer is a bilayer.

18. The method of claim 17, wherein the contact layer comprises a layer of doped ZnTe and a layer of a material selected from the group consisting of a metal, and a transparent conducting oxide.

* * * * *